(12) United States Patent
Ren et al.

(10) Patent No.: US 10,401,417 B2
(45) Date of Patent: Sep. 3, 2019

(54) ELECTRICAL FAULT LOCATION DETERMINATION IN A DISTRIBUTION SYSTEM BASED ON PHASOR INFORMATION

(71) Applicant: General Electric Technology GmbH, Baden (CH)

(72) Inventors: Jinfeng Ren, College Station, TX (US); Subrahmanyam Saraswati Venkata, Oro Valley, AZ (US)

(73) Assignee: General Electric Technology GmbH, Baden (CH)

( * ) Notice: Subject to any disclaimer, the term of this patent is extended or adjusted under 35 U.S.C. 154(b) by 643 days.

(21) Appl. No.: 14/158,108

(22) Filed: Jan. 17, 2014

(65) Prior Publication Data
US 2014/0229127 A1     Aug. 14, 2014

Related U.S. Application Data
(60) Provisional application No. 61/764,463, filed on Feb. 13, 2013.

(51) Int. Cl.
| | |
|---|---|
| *G01R 31/08* | (2006.01) |
| *G01R 19/25* | (2006.01) |
| *H02H 3/40* | (2006.01) |

(52) U.S. Cl.
CPC ......... *G01R 31/086* (2013.01); *G01R 31/088* (2013.01); *H02H 3/40* (2013.01);
(Continued)

(58) Field of Classification Search
CPC ...................................................... H02H 3/405
See application file for complete search history.

(56) References Cited

U.S. PATENT DOCUMENTS

| | | | | |
|---|---|---|---|---|
| 5,428,549 | A | * | 6/1995 | Chen .................... G01R 31/088 361/80 |
| 5,455,776 | A | * | 10/1995 | Novosel ............... G01R 31/088 324/509 |

(Continued)

OTHER PUBLICATIONS

J. Zhu, D. L. Lubkeman, and A. A. Girgis, "Automated fault location and diagnosis on electric power distribution feeders," IEEE Trans. on Power Delivery, vol. 12, No. 2, pp. 801-809, Apr. 1997.
(Continued)

*Primary Examiner* — Gregory J Toatley, Jr.
*Assistant Examiner* — Brandon J Becker
(74) *Attorney, Agent, or Firm* — Fitch Even Tabin & Flannery LLP

(57) ABSTRACT

Determination of information relating to a location of an electrical fault in an electrical energy distribution system based on phasor information is disclosed. A component can receive phasor information and electrical energy distribution system information. The system can determine a distance factor based on the phasor information. The distance factor can be employed to determine fault location information. A set of fault location information can be generated. Fault location information can be corrected for fault characteristics. Equivalent circuit models can be employed in determining the distance factor. Fault locations can be validated to facilitate generating subset of fault location information. Access to fault location information can be facilitated.

25 Claims, 11 Drawing Sheets

(52) U.S. Cl.
CPC ......... *G01R 19/2513* (2013.01); *H02H 3/405* (2013.01); *Y02E 60/728* (2013.01); *Y04S 10/265* (2013.01); *Y04S 10/522* (2013.01)

(56) References Cited

U.S. PATENT DOCUMENTS

| | | | | |
|---|---|---|---|---|
| 5,661,664 | A * | 8/1997 | Novosel | H02H 3/402 324/512 |
| 5,825,189 | A * | 10/1998 | Johns | G01R 31/085 324/525 |
| 5,839,093 | A * | 11/1998 | Novosel | G01R 31/086 702/59 |
| 6,256,592 | B1 * | 7/2001 | Roberts | G01R 31/088 324/512 |
| 6,584,417 | B1 * | 6/2003 | Hu | G01R 31/085 361/522 |
| 8,131,485 | B2 * | 3/2012 | Balcerek | G01R 31/088 702/59 |
| 9,979,193 | B2 * | 5/2018 | Wilson | H02J 3/1807 |
| 2003/0055585 | A1 * | 3/2003 | Stoupis | H02H 1/00 702/58 |
| 2003/0105608 | A1 * | 6/2003 | Hart | G01D 4/004 702/122 |
| 2004/0167729 | A1 * | 8/2004 | Saha | G01R 31/088 702/58 |
| 2005/0040809 | A1 * | 2/2005 | Uber, III | G01R 15/142 324/117 R |
| 2008/0036472 | A1 * | 2/2008 | Collins, Jr. | G01R 19/2513 324/649 |
| 2010/0102824 | A1 * | 4/2010 | Tremblay | G01R 31/088 324/522 |
| 2010/0301872 | A1 * | 12/2010 | Kereit | H02H 7/28 324/521 |
| 2011/0264389 | A1 * | 10/2011 | Mynam | G01R 31/086 702/58 |
| 2014/0164377 | A1 * | 6/2014 | Kanabar | H04Q 9/00 707/737 |

OTHER PUBLICATIONS

J. Mora-Florez, J. Melendez, and G. Garrillo-Caiecedo, "Comparison of impedance based fault location methods for power distribution systems," Electric Power Systems Research, vol. 78, No. 4, pp. 657-666, Apr. 2008.

* cited by examiner

ELECTRICAL FAULT LOCATION DETERMINATION IN A DISTRIBUTION SYSTEM BASED ON PHASOR INFORMATION

RELATED APPLICATION

This application claims priority to U.S. Provisional Application No. 61/764,463, filed 13 Feb. 2013, and entitled "A Synchrophasor Based Fault Location Method for Distribution Systems," the entirety of which is incorporated herein by reference.

TECHNICAL FIELD

The disclosed subject matter relates to determination of a location of an electrical fault in an electrical energy distribution system based on phasor information.

BACKGROUND

By way of brief background, electrical energy distribution systems can experience electrical faults that can affect the distribution of electricity. Expediting a determination of the location of a fault in an electrical energy distribution system can allow for improved servicing of the fault to correct associated effects on the electrical energy distribution system. As an example, where a tree limb falls across two conductors in a power grid, current flowing across the branch between the conductors can affect the performance of the power grid, such as by altering the phase of voltages carried by the conductors, etc. As another example, a vehicle accident can snap a power pole, dropping a conductor to the ground such that the electrical energy distribution system experiences a ground fault on that line. Faults such as these can affect the distribution of electrical energy in the electrical energy distribution system, for example, causing a power outage. Determination of the location of these example faults can aid in corrective actions such as repair or maintenance. Given the importance of electrical energy distribution systems, improvements over conventional techniques of fault location, such as having repair crews drive and inspect a conductor path to find a fault, can provide for faster corrective action in response to a fault in the electrical energy distribution system.

DETAILED DESCRIPTION

Figure 1:
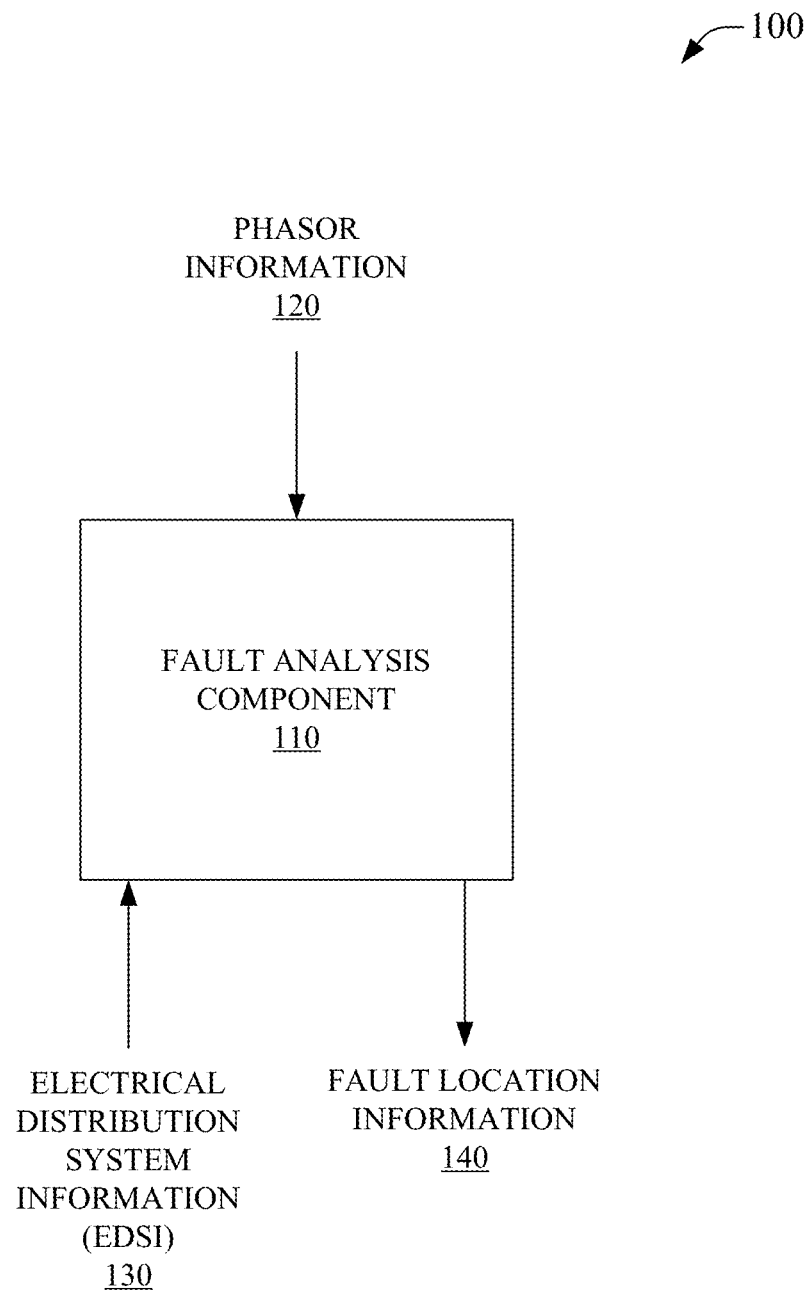
FIG. 1 is an illustration of a system that facilitates determining fault location information based on phasor information in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

Accurate knowledge of fault location in an electrical energy distribution system(s) can aid in the repair process, expedite system restoration, and thus reduce outage duration. Locating a fault in an electrical energy distribution system can be accomplished by employing synchrophasor measurements, hereinafter phasor information, which can be provided by Phasor Measurement Units (PMUs). Phasor information can include electrical characteristics, e.g., voltage, current, phase, etc., time information, PMU location information, identification information, etc. As such, by using voltage and current phasor measurements at substations and/or feeder heads, obtained through suitable communication schemes, candidate fault locations can be identified by line segment analysis, either in an iterative analysis or non-linear analysis process. Iterative line segment analysis can reduce computational complexity. Measurements from remote devices, e.g., PMUs, electrical characteristic sensors, physical sensors, etc., can be employed to reduce a set of suspected fault locations. This type of fault location can be effective for both active and passive electrical energy distribution systems, radial and looped electrical energy distribution system topologies, high impedance faults, etc. Further, fault location determinations can be unconstrained by a dedicated pattern of PMU/sensor locations.

Locating a fault in an electrical energy distribution system can help the repair process, expedite system restoration, and thus reduce outage duration. Electrical energy distribution systems can have a large number of branches to facilitate distribution of electrical energy across a region. Further, the growing penetration of distributed energy resources (DERs), e.g., distributed generation, distributed energy storage, etc., and the implementation of flexible electrical energy distribution system configurations, such as looped or meshed topologies, in emerging electrical energy distribution systems have induced a change in the traditional current flow pattern across a region served by the electrical energy distribution system. These changes can make it difficult to effectively determine a location of a line fault. Conventional practices, such as line investigation by repair crews and fault analysis based methods can be time consuming, can be less accurate, etc. Conventional use of fault indicator sensor devices can narrow a determination of a faulted area, but the range of the estimated fault area can be dependent on the physical deployment of the fault sensor devices in the electrical energy distribution system, e.g., where the fault sensors have a porous granularity, the fault area can be correspondingly broad, or where there are insufficient fault sensors, the fault area can be indeterminate. In addition, conventional fault indicators can fail in tracing the fault location under bidirectional current flow conditions. Moreover, in highly branched electrical energy distribution system topologies, apparent-impedance based fault searching algorithms can yield a set of possible fault locations, without the ability to determine a subset of true fault locations, when measurements are available only at one terminal, such as measurements just from a substation. In contrast to conventional fault determination techniques, the use of phasor information, in accordance with the disclosed subject matter, can provide for locating a fault electrical energy distribution system with generally better accuracy, independence from the physical distribution of fault sensors, and effectiveness in highly branched electrical energy distribution systems.

Candidate fault location(s) can be determined, in accordance with the disclosed subject matter, by employing analysis of phasor information, such as synchrophasor measurements, from a first terminal. In an aspect, this determination can be performed by solving non-linear equations, or by iterative analysis, for a line segment(s) of an electrical energy distribution system. The use of iterative analysis can reduce computational complexity. The set of candidate fault locations can comprise an actual fault location. As such, determining a subset of more probable candidate locations can be valuable, e.g., a subset with a higher percentage of actual fault locations. This subset can be determined by comparing the first phasor information against second phasor information, e.g., phasor information from a first PMU against phasor information from a second PMU, for nodes of an electrical energy distribution system, e.g., junction nodes of branches for an electrical energy distribution system.

Figure 2:
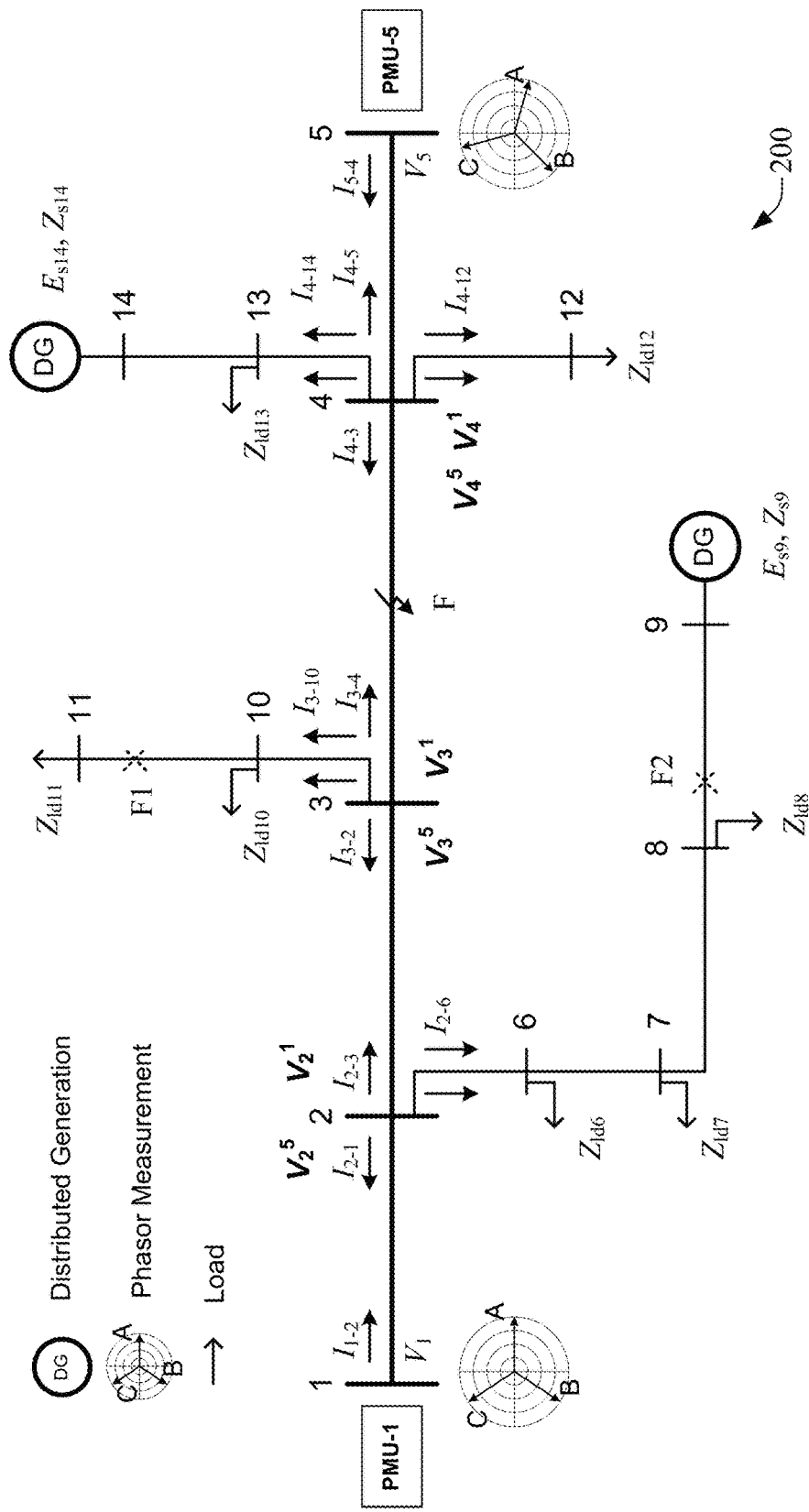
FIG. 2 is a diagram of an example electrical energy distribution system model to facilitate illustrating determination of fault location information based on phasor information in accordance with aspects of the subject disclosure.

The use of an example electrical energy distribution system model can be a useful tool in illustrating aspects of the disclosed subject matter. As such, an example 14-bus feeder system, shown in FIG. 2, is used herein to illustrate examples of various aspects of the subject disclosure. It will be noted that this example is not intended to be limiting to the disclosure and that other example electrical energy distribution system models can be employed to illustrate aspects of the subject disclosure, e.g., the model depicted in FIG. 3. Of further note, other electrical energy distribution system models can be employed but are not for the sake of clarity and brevity. Briefly, and disclosed in more detail hereinbelow, the example electrical energy distribution system model of FIG. 2 comprises a feeder that has a main circuit, four lateral branches, and two distributed generators (DGs) connected at bus-9 and bus-14, respectively. Further, the model in FIG. 2 illustrates two PMUs, installed at bus-1 and bus-5, which can provide synchronized voltage and current phasor measurements. The model also inherently illustrates knowledge of electrical energy distribution system topology, line parameters, load models, etc., which can be included in electrical distribution system information (EDSI), e.g., EDSI 130, 430, 630, 820, 920, etc.

The example electrical energy distribution system model can comprise a true fault at location 'F' in FIG. 2, on the conductor between node 3 and node 4. Hereinafter a naming convention can be employed to describe the conductor between node A and node B as "line <node A>-<node B>", e.g., the conductor between node 3 and node 4 can be termed "line 3-4". Analysis of the example electrical energy distribution system model can include finding a set of candidate locations, e.g., possible fault locations. The analysis can begin at a bus at node 1 of FIG. 2. Hereinafter, a naming convention can be employed to describe a bus at node A as "bus-A", e.g., a bus at node 1 can be termed "bus-1". A fault distance can be calculated based on apparent impedance to determine if the fault is likely within line segment between node 1 and node 2 (line 1-2). Where the fault is not determined to be on line 1-2, phasor information at bus-2 can be calculated, e.g., in terms of a voltage drop that can includes any capacitance effect. Lateral branches, such as line 2-6 and line 2-3, can be analyzed by employing a predicate that one branch is faulted, such that the current flows on the other presumably non-faulted, i.e., "healthy", lines can be calculated using Thevenin equivalent circuits. As an example in FIG. 2, the predicate that line 2-3 is faulted can be employed such that the Thevenin equivalent circuit from bus-2 to bus-9 can be determined to be the self-impedance of the bus impedance matrix and open circuit voltage at bus-2. In an aspect, for passive networks, the equivalent impedance can be utilized. The above procedures can be repeated, iteratively, for other line segments. Where the calculated distance to the fault matches a distance into a particular line segment, a candidate fault location can be noted, e.g., a possible fault location can be determined. In FIG. 2, three candidate locations, designated as F, F1 and F2 on line 3-4, 10-11 and 8-9 respectively, can be determined. Phasor information can comprise voltage information, for example, designated as $V_2^1$, $V_3^1$, etc., wherein the superscript represents the PMU from which the phasor is measured and the subscript represents the respective node, can be calculated, e.g., $V_2^1$ corresponds to junction node 2 on the main circuit measured from PMU-1, and $V_2^5$ corresponds to junction node 2 of the main circuit measured from PMU-5.

A subset of the set of possible fault locations can be determined by eliminating possible fault locations on non-faulted lines from the set. Phasor information can be received for a node. This phasor information can comprise first phasor information for the node from a first PMU and second phasor information for the node from a second PMU. The first and second phasor information can facilitate determining likely fault location information. As an example, for possible fault location F2, voltage phasor information at bus-2, denoted as $V_2^1$ and $V_2^5$, can be determined from bus-1 (e.g., PMU-1) and bus-5 (e.g., PMU-5) respectively. F2 can be determined to be a likely actual fault location where $|V_2^1 - V_2^5| \le \varepsilon$, where $\varepsilon$ is a predefined threshold value. As such, where F2 is not determined to be a likely actual fault location, then F2 can be removed from the set of possible fault locations. In an aspect, the voltage difference, $V_2^1 - V_2^5$, can be measured by total vector error (TVE). Similarly, F1 can be removed based on voltage phasor information at bus-3, denoted as $V_3^1$ and $V_3^5$, can be determined from bus-1 (e.g., PMU-1) and bus-5 (e.g., PMU-5) respectively.

In an aspect, the impedance of an actual fault can affect location determination in some instances. This can be corrected for where phasor information from two nodes is available. Of note, for a fault on a main circuit covered by two measurement points, for example line 1-2, 2-3, 3-4 and 4-5 in FIG. 2, the value of the fault impedance can have no impact on the location determination where remote current measurement information is employed. In a branch circuit, when given one terminal measurement for a line segment, for example a fault occurring on line 6-9, an iterative method can be used to eliminate the effect of fault resistance.

In an embodiment, a system can receive phasor information related to determining a location of a fault in an electrical energy distribution system and receive electrical distribution system information related to the electrical energy distribution system. The system can further determine fault location information based on the phasor information and the electrical distribution system information. Additionally, the system can facilitate access to the fault location information.

In another embodiment, a method can comprise receiving phasor information comprising voltage information in response to detecting a fault event for an electrical energy distribution system. The method can further receive electrical distribution system information comprising parameters related to the electrical energy distribution system. Based on the phasor information and the electrical distribution system information, the method can determine fault location information. The method can additionally comprise facilitating access to the fault location information.

Moreover, in a further embodiment, a computer readable storage device can cause a device to receive first phasor information related to determining a first candidate location of a fault in an electrical energy distribution system, and receive second phasor information related to determining a second candidate location of the fault in the electrical energy distribution system. The device can also receive electrical distribution system information related the electrical energy distribution system. The device can then be caused to determine a fault location information set comprising fault information related to the fault based on the first phasor information and the electrical distribution system information. A subset of the fault location information set can then be determined, based on validating the fault by employing the second phasor information and the electrical distribution system information. The device can then be caused to facilitate access to the fault information of the subset.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages and novel features of the disclosed subject matter will become apparent from the following detailed description when considered in conjunction with the provided drawings.

FIG. 1 is an illustration of a system 100, which facilitates determining fault location information based on phasor information in accordance with aspects of the subject disclosure. System 100 can comprise fault analysis component 110 that can facilitate analysis of phasor information related to determining the location of a fault in an electrical energy distribution system. Fault analysis component 110 can comprised in a smartphone, tablet computer, laptop computer, or any other type of mobile device, or can be a terminal, personal computer, desktop computer, mainframe, server, energy management system device, or other non-mobile device. Fault analysis component 110 can receive phasor information 120. Phasor information 120 can comprise phasor information related to one or more nodes of the electrical energy distribution system. In an aspect, phasor information 120 can comprise phasor measurement information from a phasor measurement unit (PMU). Phasor measurement information can comprise information related to voltage, current, resistance, impedance, admittance, phase, measurement timestamp, etc. In an embodiment, phasor measurement information can be a synchrophasor measurement from a device that measures the electrical waves on an electricity grid using a common time source, such as Universal Coordinated Time, etc., for synchronization. Time synchronized measurements can facilitate real-time measurements of multiple remote measurement points on the grid in a synchronized manner. This can, in some embodiments, allow for a snapshot of electrical characteristic values for the electrical energy distribution system at multiple nodes simultaneously, which can aid analysis of electrical energy distribution system events, such as fault analysis.

Fault analysis component 110 can further receive electrical distribution system information (EDSI) 130. EDSI 130 can comprise a model of the electrical energy distribution system or parts of the electrical energy distribution system. EDSI 130 can further comprise measurement information from one or more nodes of the electrical energy distribution system, e.g., sensor information from various measurement points in the electrical energy distribution system. As an example, EDSI 130 can comprise information related to a distributed generation (DG) source connected to the electrical energy distribution system, e.g., voltage, current, admittance, reactance, etc., information for a DG source placing energy into the electrical energy distribution system, etc.

Fault analysis component 110 can facilitate access to fault location information 140. Fault location information 140 can comprise information related to a fault, including conductor distance to a fault, geographic distance to a fault, a location of a fault, electrical characteristics of a fault, etc. Further, fault location information 140 can comprise a set of possible or candidate fault locations, a subset or reduced set of possible fault locations that excludes candidate faults not satisfying a determined criterion, no possible faults, some possible faults, all possible faults, faults resident in designated portions of the electrical energy distribution system, faults satisfying a determined priority criterion, etc.

Fault analysis component 110 can determine a set of possible fault locations based on phasor information 120. Phasor information 120 can comprise voltage information for a first node, current information for current flowing between the first node and a second node. Further, EDSI 130 can comprise information for an impedance of the electrical energy distribution system line, hereinafter 'line', between the first node and the second node. This information can allow fault analysis component 110 to determine a distance factor, d, that can be related to the conductor distance between the first node and the fault. The distance factor, d, can be related to the ratio of the voltage and current measured at the first node, when a fault is present, to the expected voltage and current at the first node based on a model of the electrical energy distribution system between the first node and the second node in the absence of a fault. In an embodiment, the distance factor can be described by Eq. 1, Eq. 2, etc., as disclosed hereinbelow in more detail with regard to FIG. 2, FIG. 3, etc.

An electrical energy distribution system can be analyzed by fault analysis component 110 in segments. A segment can be a portion of the electrical energy distribution system between a first node and a second node. In an aspect, the concatenation of the all segments of an electrical energy distribution system can describe the electrical energy distribution system. Segmental analysis of the electrical energy distribution system by fault analysis component 110 can determine the presence of a possible fault at a first segment of the electrical energy distribution system before proceeding with analysis on another segment of the electrical energy distribution system. Where a possible fault is determined for a segment, the set of fault location information can be updated to include information relating to the possible fault. As such, the set of fault location information can comprise a plurality of possible fault locations.

In an embodiment, fault analysis component 110 can update fault information comprising the set of fault location information to compensate for errors that can be introduced by the inherent electrical characteristics of a corresponding fault. As an example, a first fault, F, at a first location can have a different resistance than a second fault, F', at the first location. The difference in the resistance of F and F' can result in different determined values of the distance factor, d, despite both faults being located at the first location. Compensating for the different resistances can therefore result in an updated d value for both F and F' that can allow for more accurate determination of their being at the first location.

Fault analysis component 110 can further determine a subset of possible fault locations from the set of fault locations based on phasor information 120. Whereas phasor information 120 can include phasor information from a second PMU, this information can be used to validate fault locations in the set of possible fault locations. This can serve to remove possible fault information in the subset for possible faults that do not meet a threshold criterion. As an example, where the a possible fault location determined from phasor information from a first PMU is within a determined distance of a possible fault location determined from phasor information from a second PMU, the possible fault location can be regarded as validated and can be included in the subset of possible fault locations. The use of a threshold criterion in validating possible fault locations can compensate for errors in EDSI 130, errors in phasor information 120, etc.

Fault analysis component 110 can facilitate access to the determined fault location information, including to the set or subset of possible fault locations, conductor distances, locations, etc. In an embodiment, real world analysis indicated determination of an actual faulted line was within 1% of the line length for an electrical energy distribution system, employing a looped topology, serving over 17,000 customers, having 609 line segments, 419 distribution transformers, and two distributed generation sources.

FIG. 2 is a diagram of an example electrical energy distribution system model 200 to facilitate illustrating determination of fault location information based on phasor information in accordance with aspects of the subject disclosure. As stated herein, the use of an example electrical energy distribution system model can be a useful tool in illustrating aspects of the disclosed subject matter. An example 14-bus feeder system, shown in FIG. 2, is used herein to illustrate examples of various aspects of the subject disclosure. It will be noted that this example is not intended to be limiting to the disclosure and is presented to improve understanding of the disclosed subject matter. Generally, fault location determination can be employed when a fault has been detected in an electrical energy distribution system. Phasor information based fault location can find candidate fault locations and then reduce the candidate fault locations to increase the likelihood of determining an actual fault location.

In FIG. 2, the 14-bus feeder system can comprise a main circuit, e.g., line 1-2, 2-3, 3-4 and 4-5, four lateral branches, two distributed generators, e.g., DGs, connected at bus-9 and bus-14 respectively, and five load points, e.g., at bus-6, bus-7, bus-8, bus-10 and bus-13. Two PMUs, situated at bus-1 and bus-5, can provide phasor information, e.g., synchronized bus voltage and line current phasor measurements, which can be denoted as $V_1$, $I_{1-2}$, $V_5$ and $I_{5-4}$. For clarity and brevity, phasing of the circuits is neglected in discussion related to FIG. 2, though the disclosed subject matter can be applied to multiphase circuits and can expressly be applied to single-, two- and three-phase networks, among others. EDSI is available and comprises a knowledge of network topology, short-circuit models and parameters of lines, generators and loads.

A set of possible fault locations can be determined for example electrical energy distribution system model 200 based on phasor information and EDSI. First PMU, e.g., PMU-1, which can, for example, be at a first bus proximate to the substation or feeder head, can source phasor information that can be used to find a possible fault point(s) based on apparent impedance for a line(s) coupled to the first bus. In FIG. 2, bus-1 can be the feeder head and bus-5 can be a bus located elsewhere in the electrical energy distribution system. Searching for a fault from bus-1, fault at location "F" on line 3-4, can be determined. Further, two other candidate fault locations can be determined, e.g., F1 and F2 on line 10-11 and line 8-9, respectively. Given the electrical characteristics for each line segment, e.g., voltage, current, and impedance, of each line segment, a fault distance, d, can be determined. The fault distance, d, can be determined, for example, by eq. 1.

$$d = \frac{V_S^{Re} \cdot I_F^{Im} - V_S^{Im} \cdot I_F^{Re}}{V_L^{Re} \cdot I_F^{Im} - V_L^{Im} \cdot I_F^{Re}}, \qquad \text{Eq. 1}$$

wherein $V_S^{Re}$ is the real voltage component at node S, $V_S^{Im}$ is the imaginary voltage component at node S, $V_L^{Re}$ is the real voltage drop component over the line $Z_L \cdot I_S$, $V_L^{Im}$ is the imaginary voltage drop component over the line $Z_L \cdot I_S$, $I_F^{Re}$ is the real current component at a fault, $I_F^{Im}$ is the imaginary current component at the fault, and given $I_F = I_S - I_R$, where the subscripts F, S, and R indicate fault, node S, and node R respectively.

TABLE I

SPECIFICATION OF PH FOR DIFFERENT TYPES OF FAULTS

| Fault Type | S-L-G | L-L/L-L-G | Three-Phase |
|---|---|---|---|
| ph | A-G or B-G or C-G | A-B or B-C or C-A | Same as L-L/L-L-G |

More generally, Eq. 1 can be presented as Eq. 2, wherein ph indicates the involved phase for different types of faults in a multiphase electrical energy distribution system. Table 1 indicates the ph for a single-line-to-ground fault (S-L-G), a line-to-line fault (L-L), a line-to-line-to-ground fault (L-L-G), and a three-phase fault, given phase A, phase B, phase C, and ground G.

$$d = \frac{V_{Sph}^{Re} \cdot I_{Fph}^{Im} - V_{Sph}^{Im} \cdot I_{Fph}^{Re}}{V_{Lph}^{Re} \cdot I_{Fph}^{Im} - V_{Lph}^{Im} \cdot I_{Fph}^{Re}}.$$ Eq. 2

Where the determined distance, d, is less than 1.0, a fault can be indicated for the corresponding line segment. As such, d represents the proportional distance between the endpoints of the line segment. As an example, where d=0.5, the fault would be halfway between the endpoints of the corresponding line segment. As another example, where d=0.25, the fault would be ¼ of the distance between the two endpoints from the first endpoint and ¾ of the distance between the two endpoints from the second endpoint. A fault indicated in a line segment can be added to the set of possible fault locations. Where a fault is not indicated in the line segment, the next line segment of the model can be analyzed. As an example, if a fault is not determined in line 1-2 (as is true in FIG. 2), the next segment can be analyzed, e.g., line 2-3 can be analyzed. The voltage at bus-2 can be calculated in terms of voltage drop as $V_2=V_1-Z_{1\text{-}2} \cdot I_{1\text{-}2}$. Line capacitance effect can be considered as part of the current leakage when appropriate, as will be appreciated by one of ordinary skill in the art.

Where two lines are connected to a node, e.g., line 2-3 and line 2-6 are connected at bus-2, then line current obeys the relationship $I_{1\text{-}2}=I_{2\text{-}3}+I_{2\text{-}6}$, according to Kirchhoff's current law, wherein the sum of currents flowing into a node is equal to the sum of currents flowing out of that node. Using a first assumption that line 2-3 is faulted, then current $I_{2\text{-}6}$ that flows on healthy lines is calculated using Thevenin equivalent circuits. Once the $I_{2\text{-}6}$ is calculated, then $I_{2\text{-}3}$ can be determined as $I_{2\text{-}3}=I_{1\text{-}2}-I_{2\text{-}6}$. Given $V_2$ from $V_2=V_1-Z_{1\text{-}2} \cdot I_{1\text{-}2}$ and $I_{2\text{-}3}$, line 2-3 can be analyzed for a possible fault by determining distance, d, by Eq. 1. Where a fault is indicated, it can be added to the set of possible fault locations. Where a fault is not indicated in the line segment, the next line segment of the model can be analyzed. In FIG. 2, a fault is not indicated in line 2-3. The voltage at bus 3 can be determined as $V_3=V_2-Z_{2\text{-}3} \cdot I_{2\text{-}3}$.

The above discussion also applies to multiple branches topologies. As such, similar to the determination for line 2-3, determining a fault on line 3-4 can include initially assuming line 3-4 is faulted such that the line current $I_{3\text{-}4}=I_{2\text{-}3}-I_{3\text{-}10}$. Applying Eq. 1, a fault distance, d, can indicate a fault, F, in line 3-4. As such, fault F can be added to the set of possible fault locations. Further analysis, can proceed under an assumption that line 3-10 is faulted, such that line current $I_{3\text{-}10}=I_{2\text{-}3}-I_{3\text{-}4}$, and applying Eq. 1. As illustrated in model 200, no fault is found for line 3-10.

The voltage at bus-10 can be computed in terms of voltage drop $V_{10}=V_3-Z_{3\text{-}10} \cdot I_{3\text{-}10}$. As such, the next line segment of the branch leading to node 11 can be analyzed. Here FIG. 2 includes an example load at node 10. The example load at bus-10 can be described in terms of an equivalent impedance, as such, the load at bus-10 is denoted as impedance $Z_{ld10}$. Therefore, the line current, $I_{10\text{-}11}$, can be determined as $I_{10\text{-}11}=I_{3\text{-}10}-V_{10}/Z_{ld10}$. Analysis of line 10-11 to determine distance, d, can indicate candidate fault F1, as illustrated. These techniques can be extended to determine faults on each line segment of model 200 based on phasor information, e.g., from PMU-1, and a model derived from existing information about the electrical distribution system, e.g., electrical distribution system information (EDSI).

In an embodiment, the set of possible or candidate fault locations can be reduced by removing fault locations that do not meet criteria indicating that a fault is a true fault. Employing phasor information, e.g., phasor information from a second PMU such as PMU 5 in FIG. 2, candidate faults can be validated. Validation of a possible fault location can comprise comparing the phasor information from different PMUs for a node. This can facilitate removing invalid fault locations to create a subset of possible fault locations that are more likely to comprise true fault locations than the set of possible fault locations.

As an example, for candidate fault locations F, F1 and F2, the corresponding nodes, e.g., junction buses, are bus-4, bus-3 and bus-2, in FIG. 2. The phasor information for a node(s), e.g., PMU-1, can already be captured in determining possible fault locations from the perspective of PMU-1. Phasor information can also include phasor information from another node, e.g., PMU-5. As such, for bus-5 from the perspective of PMU-5 in FIG. 2, given $V_5$ and $I_{5\text{-}4}$, phasor information can be determined for bus-4, bus-3 and bus-2 by assuming the electrical energy distribution system is healthy. Similar to the technique described for determining fault distances from the perspective of PMU-1, line voltage drop and Thevenin equivalent circuit information can be employed form the perspective of PMU-5. These can be illustrated in FIG. 2, as $V_2^5$, $V_3^5$, $V_4^5$, etc., wherein the superscript represents a corresponding PMU, here PMU-5, e.g., phasor information comprising electrical energy distribution system electrical characteristics from the perspective of PMU-5.

For a candidate fault location, the phasor information from a first PMU can be compared to the phasor information from a second PMU, e.g., in FIG. 2, the phasor information can be used to compare electrical characteristics of nodes associated with a candidate fault location from the perspective of PMU-1 and PMU-5 to validate a candidate fault location. As an example, the voltage of a node, M, as determined from PMU-1 phasor information can be compared to the voltage of M as determined from PMU-5 phasor information. Comparing $V_M^1$ and $V_M^5$ can be used to validate a fault associated with node M. In an embodiment, if $|V_M^1-V_M^5|>\varepsilon$, where $\varepsilon$ is a threshold value, then the candidate fault location associated with node M can be removed from the subset of fault locations. Uncertainties in the electrical energy distribution system model and phasor information can be taken into account when determining the threshold value, $\varepsilon$. In this example, Candidate fault locations F1 and F2 can be removed from the subset of fault locations based on the difference between the phasor information from different PMU perspectives being greater than a threshold value, while fault location F can be retained. This can indicate that fault location F is a true fault. In an aspect, it will be noted that while, generally, for a candidate fault location in a lateral branch, the junction bus can be unique, such as F1 and F2, a candidate on a main circuit, such as F, can have non-unique nodes, e.g., both bus-3 and bus-4 can be junction busses for fault F in FIG. 2. The validation of a fault is therefore not dependent on a unique junction bus, as illustrated.

In an aspect, the Thevenin equivalent circuit can be employed, as disclosed herein, to aid in analysis of line segments by treating a portion of the electrical energy distribution system as a Thevenin equivalent circuit. A system short circuit and open circuit model can be used to calculate the Thevenin equivalent voltage $E_{eq}$ and Thevenin equivalent impedance $Z_{eq}$. These can be used to determine electrical characteristics at a node having a portion of the electrical energy distribution system, e.g., a branch, treated as faulted or open. As an example, the determination of the current, $I_{2-6}$, given herein above, can be predicated on an assumption of a fault in line 2-3, and can therefore employ a Thevenin equivalent model for branch line 2-6, as stated. For branch line 2-6 of FIG. 2, the source voltage and impedance at bus 9 (denoted as $E_{s9}$ and $Z_{s9}$ respectively), the load admittance at bus-6, bus-7 and bus-8 (denoted as $Y_{ld6}$, $Y_{ld7}$ and $Y_{ld8}$ respectively), and the line impedance admittance (denoted as $Y_{ln2-6}$, $Y_{ln6-7}$, $Y_{ln7-8}$ and $Y_{ln8-9}$) can be considered relevant to determining the Thevenin equivalents of branch line 2-6. The dimension of each parameter depends on the number of system phases. For a three-phase system, source voltage can be a three-element vector while the impedance and admittance can be three by three matrices. The sub-network admittance matrix can be formed with lines and loads: $Y_{Net}=[Y_{m,n}]$, m, n=2, 6, 7, 8 and 9. As such, determining the current, $I_{2-6}$, for line 2-6 can comprise calculating the equivalent voltage $E_{2-6\ eq}$ and equivalent impedance $Z_{2-6\ eq}$. The network admittance matrices can be modified, wherein $Y'_{Net}=[Y'_{m,n}]$, m, n=2, 6, 7, 8 and 9, and can be obtained by replacing $Y_{9,9}$ with $Y_{9,9}+Y_{s9}$ in $Y_{Net}$, where $Y_{s9}$ is the inverse of $Z_{s9}$. The impedance matrices can then be determined, such that, $Z_{Net}=[Z_{m,n}]$=Inverse $(Y_{Net})$, and $Z'_{Net}=[Z'_{m,n}]$=Inverse $(Y'_{Net})$, m, n=2, 6, 7, 8 and 9. Current injection, $I_{In9}$, can be computed for bus-9 from source $E_{s9}$ according to: $I_{In9}=E_{s9}/(Z_{99}+Z_{s9})$. Therefore, the equivalent voltage can be determined as $E_{2-6\ eq}=Z_{29}\times I_{In9}$. Similarly, the equivalent impedance can be determined as $Z_{2-6\ eq}=Z'_{22}$. From the equivalent voltage and impedance, the current on branch line segment 2-6 can be determined as $I_{2-6}=(V_2-E_{2-6\ eq})/Z_{2-6\ eq}$.

Figure 3:
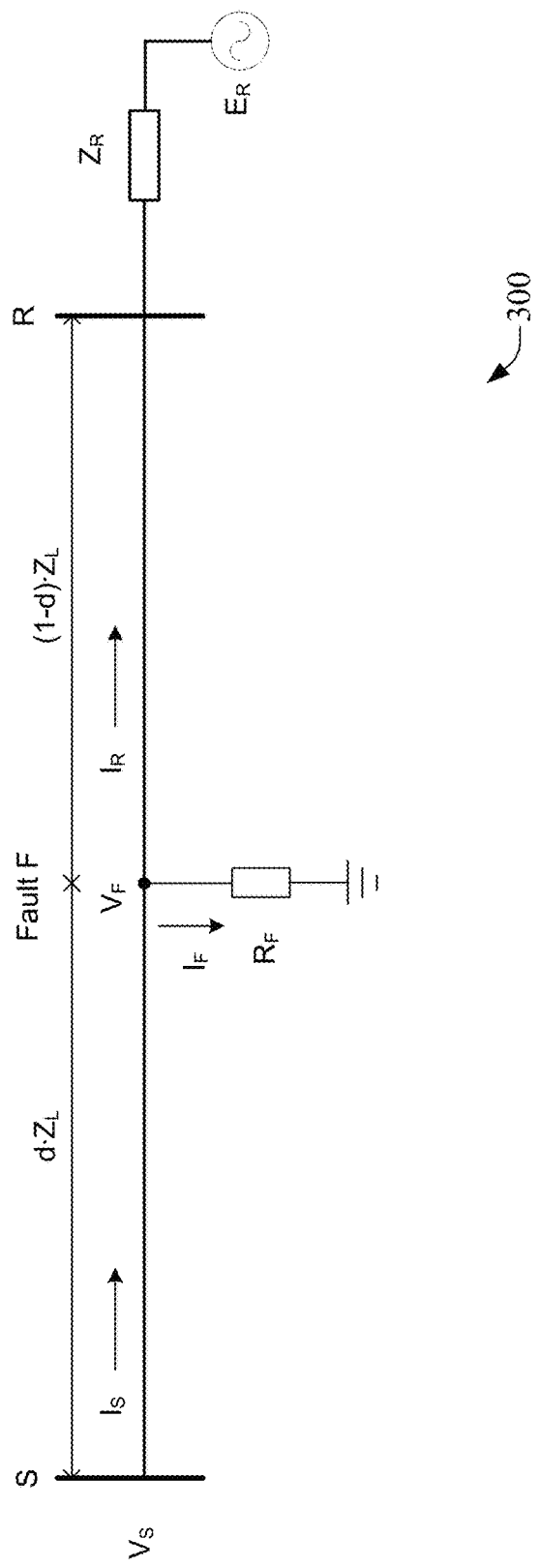
FIG. 3 is a diagram of an example electrical energy distribution system model to facilitate illustrating determination of fault location information based on phasor information in accordance with aspects of the subject disclosure.

FIG. 3 is a diagram of an example electrical energy distribution system model 300 to facilitate illustrating determination of fault location information based on phasor information in accordance with aspects of the subject disclosure. Electrical energy distribution system model 300 can, in some aspects, represent a simplification of portions of FIG. 2. In example electrical energy distribution system model 300, $V_S$, $I_S$, $I_F$ and $Z_L$ can be bus voltage for node S, line current from node S, a fault current phasor, and a line impedance between node S and node R, respectively. Moreover, $I_F=I_S-I_R$, e.g., the current though fault F must equal the difference in the current from S and the current to R. Further, $E_R$ and $Z_R$ can be a Thevenin equivalent voltage and impedance for electrical energy distribution system components beyond node R. Additionally, $R_F$ can be a fault resistance and a value, d, can be related to a proportionate distance of fault F from node S to node R, wherein d varies from 0.0 to 1.0, such that fault F can be located at (d)(the known distance between S and R) from node S, or (1−d) (the known distance between S and R) from node R. Still further, $V_L$ can be designated as a voltage drop over the line based on $Z_L \cdot I_S$, e.g., where the line has a known impedance per unit length, the current drop across that length can be determined from the current flowing though the line. Eq. 1 can be used to calculate the value d, or eq. 2 for polyphase models, as disclosed hereinabove. Of note, where d>1, then the fault can be said to not be located on the line segments between S and R, e.g., a fault can be indicated at node R where d=1, and the next line segment can be analyzed. Conversely, where d<1, a fault can be indicated on the line segment between S and R, as illustrated in FIG. 3, by fault F. This fault can be added to a set of candidate fault locations that can be validated to remove fault locations not meeting a threshold value.

Fault F, of FIG. 3, can be associated with a resistance value, e.g., fault F may not be a perfect ground fault, that can impact the estimated distance when using voltage and current from one terminal, e.g., $V_S$. The one-line model in FIG. 3 can be used to illustrate an iterative method compensating for a resistive fault. In FIG. 3, variables distance d, remote current $I_R$ and fault resistance $R_F$, can be initially unknown. $E_R$ and $Z_R$ can be Thevenin equivalent voltage and impedance for additional electrical energy distribution system model components beyond node R. Using superscripts to represent the number of the iteration, from $d^0=0.0$, then $V_F^0=V_S$, and $I_R^0=(V_F^0-E_R)/(Z_L+Z_R)$ and $I_F^1$ can be computed as $I_F^1=I_S-I_R^0$. Eq. 1 can then be used to determine distance $d^1$. These values can be employed for k additional iterations for $|d^k-d^{k-1}|>\varepsilon$, where $\varepsilon$ is a threshold value representing a tolerance level. As such, for the k=1 iteration, $V_F^1=V_S-d^1Z_LI_S$, and $I_R^1=(V_F^1-E_R)/[(1-d^1)(Z\_L+Z\_R)]$, while $|d^1-d^0|>\varepsilon$. It will be noted that non-linear equations can also be employed to compensate for resistive faults, as will be appreciated by one of ordinary skill in the art, although for the sake of clarity and brevity these non-linear equations are not presented but do remain within the scope of the present disclosure.

Figure 4:
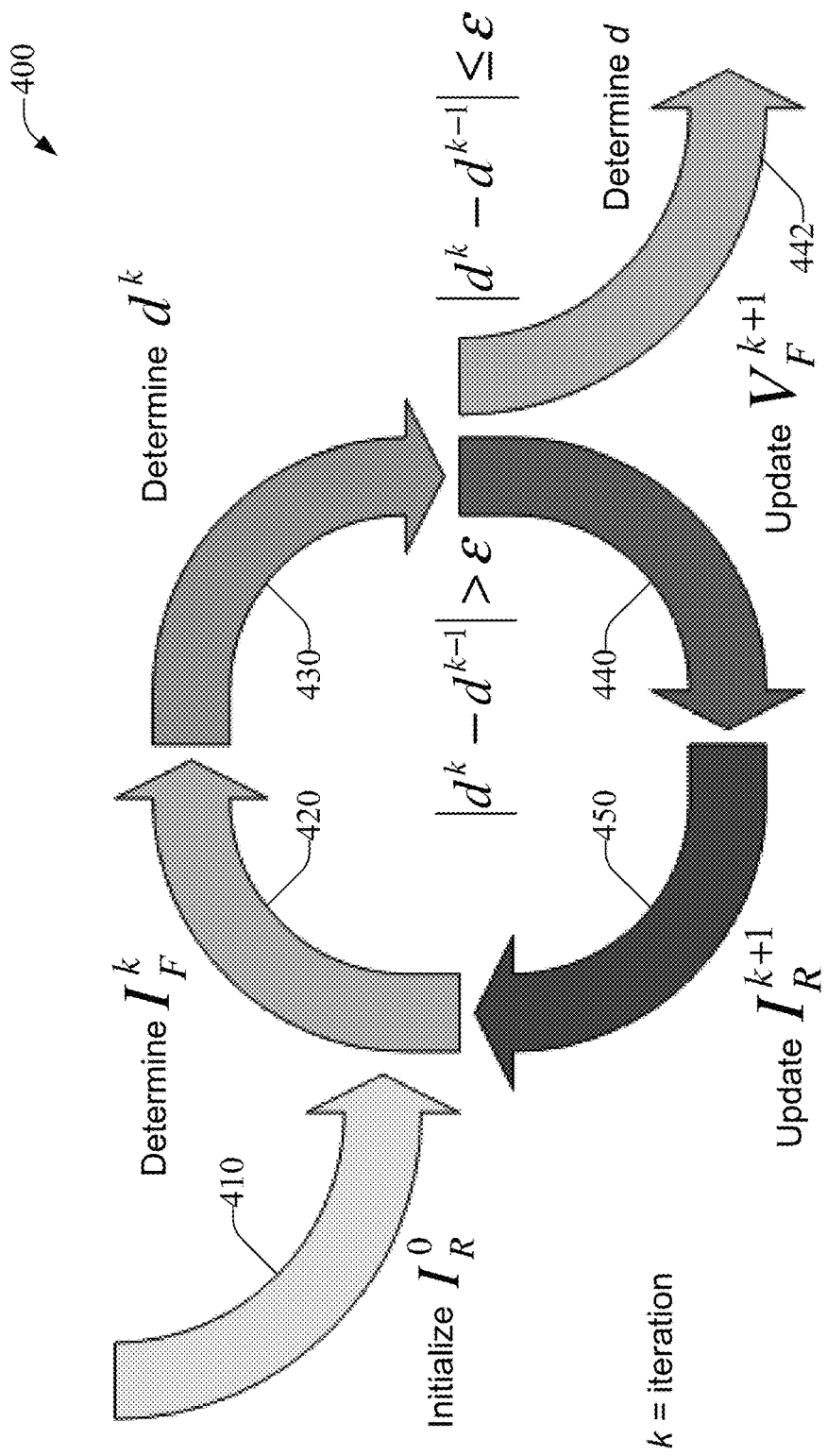
FIG. 4 is a diagram illustrating an example correction of fault location information based on electrical characteristics associated with a fault at the fault location in accordance with aspects of the subject disclosure

FIG. 4 is a diagram 400 illustrating an example of correction of fault location information based on electrical characteristics associated with a fault at the fault location in accordance with aspects of the subject disclosure. As disclosed herein, an electrical energy distribution system model, e.g., 200, 300, etc., can facilitate determination of a fault location based on phasor information. This determination of fault location can include correction of fault location information to compensate for the electrical characteristics inherent in the fault, e.g., a resistive fault. This aspect is discussed hereinabove in relation to example electrical energy distribution system model 300. In model 300, $V_S$, $I_S$, $I_F$ and $Z_L$ can be bus voltage for node S, line current from node S, a fault current phasor, and a line impedance between node S and node R, respectively. Moreover, $I_F=I_S-I_R$, e.g., the current though fault F must equal the difference in the current from S and the current to R. Further, $E_R$ and $Z_R$ can be a Thevenin equivalent voltage and impedance for electrical energy distribution system components beyond node R. Additionally, $R_F$ can be a fault resistance and a value, d, can be related to a proportionate distance of fault F from node S to node R, wherein d varies from 0.0 to 1.0, such that fault F can be located at (d)(the known distance between S and R) from node S, or (1−d)(the known distance between S and R) from node R. Still further, $V_L$ can be designated as a voltage drop over the line based on $Z_L \cdot I_S$, e.g., where the line has a known impedance per unit length, the current drop across that length can be determined from the current flowing though the line. These same values can be employed in diagram 400. As in the discussion of model 300, Eq. 1 can be used to calculate the value d, or eq. 2 for polyphase models, as disclosed hereinabove, for values employed in diagram 400 and fault information, including value d, can be included in a set of candidate fault locations that can be validated to remove fault locations not meeting a threshold value.

A fault F can be associated with a set of electrical characteristics inherent in the fault itself, e.g., fault F may be a resistive fault, which can affect the determined distance of the fault from a node. Whereas the variables distance d, remote current $I_R$ and fault resistance $R_F$, can be initially unknown, and $E_R$ and $Z_R$ can be Thevenin equivalent voltage and impedance for additional electrical energy distribution system model components beyond node R, from $d^0=0.0$, wherein the superscripts represent the number of the iteration, then $V_F^0=V_S$, and $I_R^0=(V_F^0-E_R)/(Z_L+Z_R)$ as illustrated at 410. At 420, $I_F^1$ can be computed as $I_F^1=I_S-I_R^0$. Eq. 1 can then be used to determine distance $d^1$, at 430. These values can be employed for k additional iterations for $|d^k-d^{k-1}|>\varepsilon$, where $\varepsilon$ is a threshold value representing a tolerance level. Therefore, at 440, where $|d^k-d^{k-1}|>\varepsilon$, the value of $V_F$ can be updated for the next iteration, e.g., $V_F^{1+k}$ can be updated. As such, for the k=1+0 iteration (incrementing k from the $0^{th}$ iteration), $V_F^1=V_S-d^1Z_LI_S$, while $|d^1-d^0|>\varepsilon$. At 450, $I_R^{1+k}$ can similarly be updated as $I_R^1=(V_F^1-E_R)/[(1-d^1)(Z_L+Z_R)]$, while $|d^1-d^0|>\varepsilon$. Where $|d^1-d^0|\leq\varepsilon$, at 442, the determined value of d can be employed to update the corresponding fault location information. It will be noted that non-linear equations can also be employed to compensate for resistive faults, as will be appreciated by one of ordinary skill in the art, although for the sake of clarity and brevity these non-linear equations are not presented but do remain within the scope of the present disclosure.

Figure 5:
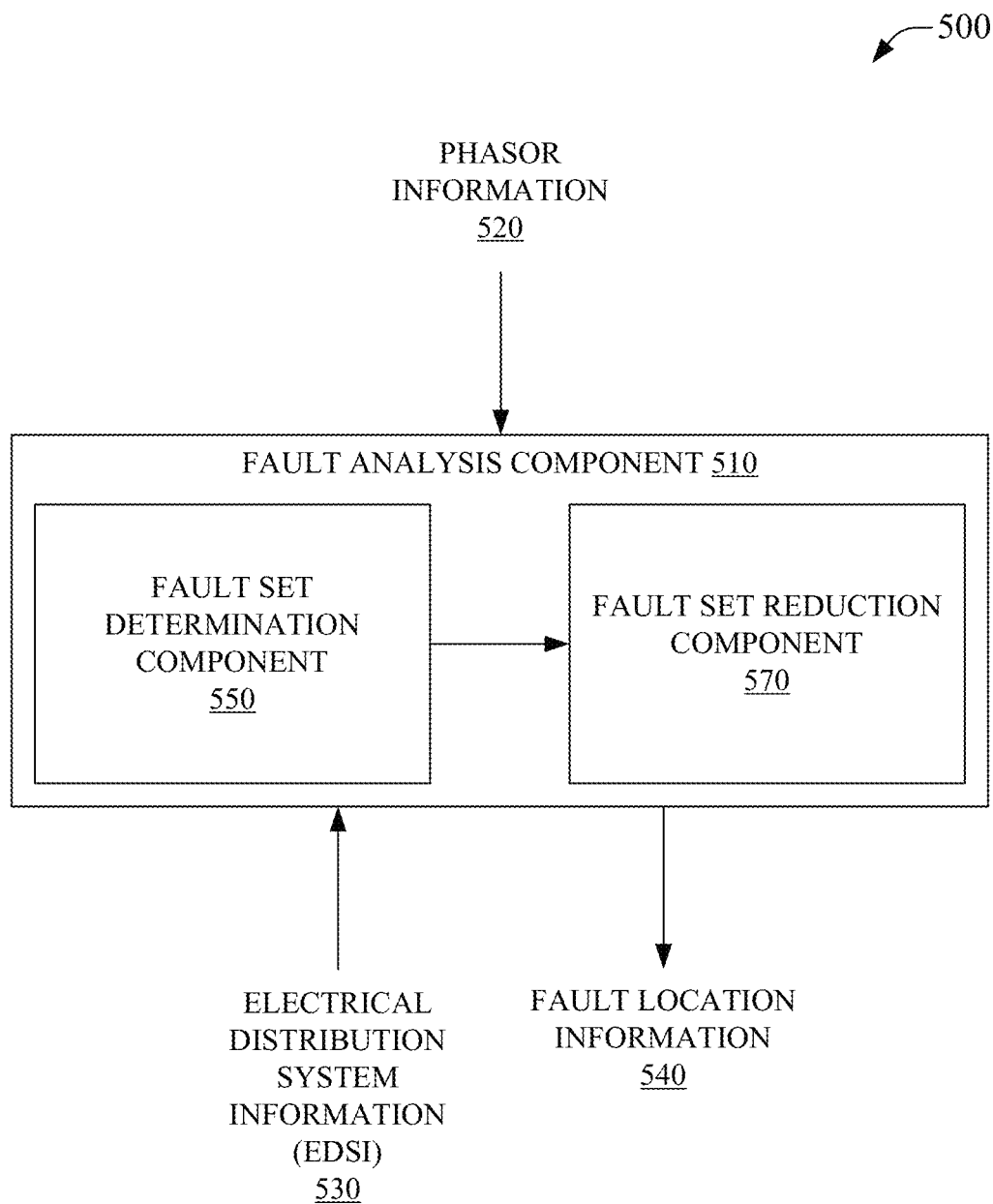
FIG. 5 illustrates a system that facilitates determining a fault set, comprising fault location information, based on phasor information in accordance with aspects of the subject disclosure.

FIG. 5 illustrates a system 500 that facilitates determining a fault set, comprising fault location information, based on phasor information in accordance with aspects of the subject disclosure. System 500 can comprise fault analysis component 510 that can facilitate analysis of phasor information related to determining the location of a fault in an electrical energy distribution system. Fault analysis component 510 can receive phasor information 520. Phasor information 520 can comprise phasor information related to one or more nodes of the electrical energy distribution system. In an aspect, phasor information 520 can comprise phasor measurement information from a phasor measurement unit (PMU). In an embodiment, phasor measurement information can be a synchrophasor measurement from a device that measures the electrical waves on an electricity grid using a common time source for synchronization.

Fault analysis component 510 can further receive electrical distribution system information (EDSI) 530. EDSI 530 can comprise a model of the electrical energy distribution system or parts of the electrical energy distribution system. EDSI 530 can further comprise measurement information from one or more nodes of the electrical energy distribution system, e.g., sensor information from various measurement points in the electrical energy distribution system.

Fault analysis component 510 can facilitate access to fault location information 540. Fault location information 540 can comprise information related to a fault. Further, fault location information 540 can comprise a set of possible or candidate fault locations, a subset or reduced set of possible fault locations that excludes candidate faults not satisfying a determined criterion, etc.

Fault analysis component 510 can comprise a fault set determination component 550. Fault set determination component 550 can determine a set of possible fault locations based on phasor information 520. Phasor information 520 can comprise voltage information for a first node, current information for current flowing between the first node and a second node. Further, EDSI 530 can comprise information for an impedance of the electrical energy distribution system line, hereinafter 'line', between the first node and the second node. This information can allow fault set determination component 550 to determine a distance factor, d, that can be related to the conductor distance between the first node and the fault. In an embodiment, the distance factor can be described by Eq. 1, Eq. 2, etc., as disclosed herein in more detail with regard to FIG. 2, FIG. 3, etc.

An electrical energy distribution system can be analyzed by fault analysis component 510 in segments. A segment can be a portion of the electrical energy distribution system between a first node and a second node. In an aspect, the concatenation of the all segments of an electrical energy distribution system can describe the electrical energy distribution system. Segmental analysis of the electrical energy distribution system by fault analysis component 510 can determine the presence of a possible fault a first segment of the electrical energy distribution system before proceeding with analysis on another segment of the electrical energy distribution system. Where a possible fault is determined for a segment, fault set determination component 550 can update a set of fault location information to include information relating to the possible fault. As such, the set of fault location information can comprise a plurality of possible fault locations.

Fault analysis component 510 can further comprise fault set reduction component 560 that can determine a subset of possible fault locations from the set of fault locations determined by fault set determination component 550. Determination of a subset of candidate fault locations can be based on phasor information 520. Whereas phasor information 520 can include phasor information from a second PMU, this information can be used to validate fault locations in the set of possible fault locations. This can facilitate removal of possible fault information in set of candidate fault locations when determining the subset of possible faults when candidate fault locations do not meet a threshold criterion. As an example, where the a possible fault location determined from phasor information from a first PMU is outside of a determined distance of a possible fault location determined from phasor information from a second PMU, the possible fault location can be regarded as invalid and can be excluded in the subset of possible fault locations.

Figure 6:
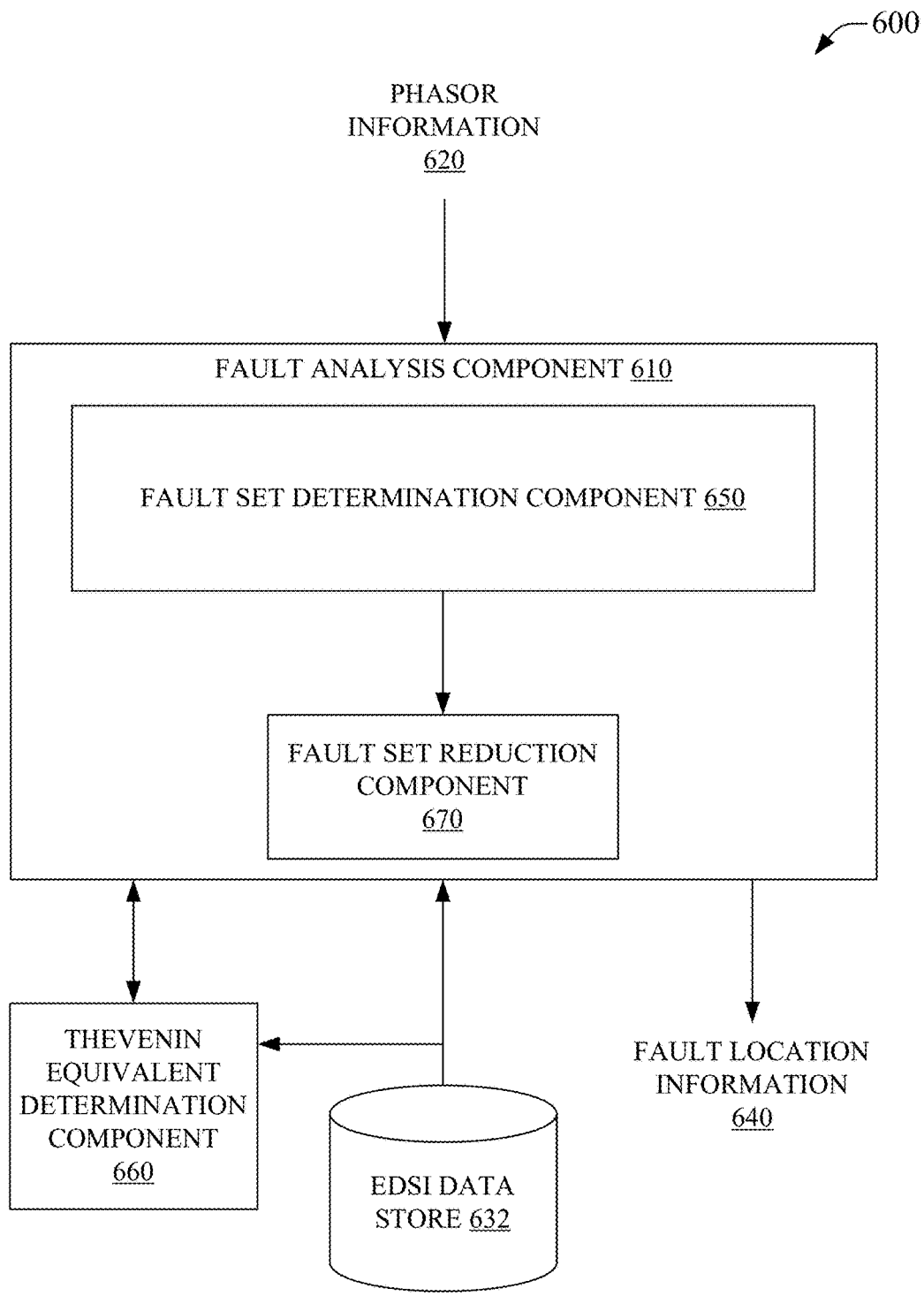
FIG. 6 illustrates a system that facilitates determining a fault set, comprising fault location information, based on phasor information and Thevenin equivalent information in accordance with aspects of the subject disclosure.

FIG. 6 illustrates a system 600 that facilitates determining a fault set, comprising fault location information, based on phasor information and Thevenin equivalent information in accordance with aspects of the subject disclosure. System 600 can comprise fault analysis component 610 that can facilitate analysis of phasor information related to determining the location of a fault in an electrical energy distribution system. Fault analysis component 610 can receive phasor information 620. Phasor information 620 can comprise phasor information related to one or more nodes of the electrical energy distribution system. In an aspect, phasor information 620 can comprise phasor measurement information from a phasor measurement unit (PMU). In an embodiment, phasor measurement information can be a synchrophasor measurement from a device that measures the electrical waves on an electricity grid using a common time source for synchronization.

Fault analysis component 610 can further receive electrical distribution system information (EDSI) from an EDSI data store 632. EDSI data store 632 can be a repository for information that can include a model of the electrical energy distribution system or parts of the electrical energy distribution system. EDSI data store 632 can further store measurement information from one or more nodes of the electrical energy distribution system, e.g., sensor information from various measurement points in the electrical energy distribution system.

Fault analysis component 610 can facilitate access to fault location information 640. Fault location information 640 can comprise information related to a fault. Further, fault location information 640 can comprise a set of possible or candidate fault locations, a subset or reduced set of possible fault locations that excludes candidate faults not satisfying a determined criterion, etc.

Fault analysis component 610 can determine a set of possible fault locations based on phasor information 620. Phasor information 620 can comprise voltage information for a first node, current information for current flowing between the first node and a second node. Further, EDSI received from EDSI data store 632 can comprise information for an impedance of the electrical energy distribution system line, hereinafter 'line', between the first node and the second node. This information can allow fault analysis component 610 to determine a distance factor, d, that can be related to the conductor distance between the first node and the fault.

An electrical energy distribution system can be analyzed by fault analysis component 610 in segments. A segment can be a portion of the electrical energy distribution system between a first node and a second node. In an aspect, the concatenation of the all segments of an electrical energy distribution system can describe the electrical energy distribution system. Segmental analysis of the electrical energy distribution system by fault analysis component 610 can determine the presence of a possible fault a first segment of the electrical energy distribution system before proceeding with analysis on another segment of the electrical energy distribution system. Where a possible fault is determined for a segment, the set of fault location information can be updated to include information relating to the possible fault. As such, the set of fault location information can comprise a plurality of possible fault locations.

Segmental analysis of the electrical energy distribution system can employ equivalent circuits. Equivalent circuits can comprise simplified models representing portions of the electrical energy distribution system. In an embodiment, an equivalent circuit can be a Thevenin equivalent circuit that can represent the electrical energy distribution system or portions thereof, as resistor and source. Other equivalent circuits can similarly be employed, but for clarity and brevity are not further discussed herein. As such, fault analysis component 610 can receive a Thevenin equivalent circuit from Thevenin equivalent determination component 660. Thevenin equivalent determination component 660 can receive EDSI and can determine Thevenin equivalent circuits for portions of the electrical energy distribution system. This can facilitate segmental analysis by treating portions of an electrical grid beyond the segment under analysis as a Thevenin equivalent circuit. Thevenin equivalent circuits can be received by fault set determination component 650 and employed in determining potential fault location information.

Fault analysis component 610 can comprise a fault set determination component 650. Fault set determination component 650 can determine a set of possible fault locations based on phasor information 620. Phasor information 620 can comprise voltage information for a first node, current information for current flowing between the first node and a second node. Further, EDSI can comprise information for an impedance of the electrical energy distribution system line, hereinafter 'line', between the first node and the second node. This information can allow fault set determination component 650 to determine a distance factor, d, that can be related to the conductor distance between the first node and the fault. In an embodiment, the distance factor can be described by Eq. 1, Eq. 2, etc., as disclosed herein in more detail with regard to FIG. 2, FIG. 3, etc. Fault set determination component 650 can determine a possible fault on a line segment. Further, analysis of the line segment can employ equivalent circuits for portions of the electrical energy distribution system model outside the segment under analysis, e.g., as made available by Thevenin equivalent determination component 660.

Fault analysis component 610 can further determine a subset of possible fault locations from the set of fault locations based on phasor information 620. Whereas phasor information 620 can include phasor information from a second PMU, this information can be used to validate fault locations in the set of possible fault locations. This can serve to remove possible fault information in the subset for possible faults that do not meet a threshold criterion. As an example, where the a possible fault location determined from phasor information from a first PMU is within a determined distance of a possible fault location determined from phasor information from a second PMU, the possible fault location can be regarded as validated and can be included in the subset of possible fault locations. The use of a threshold criterion in validating possible fault locations can compensate for errors in EDSI 630, errors in phasor information 620, etc.

Figure 7:
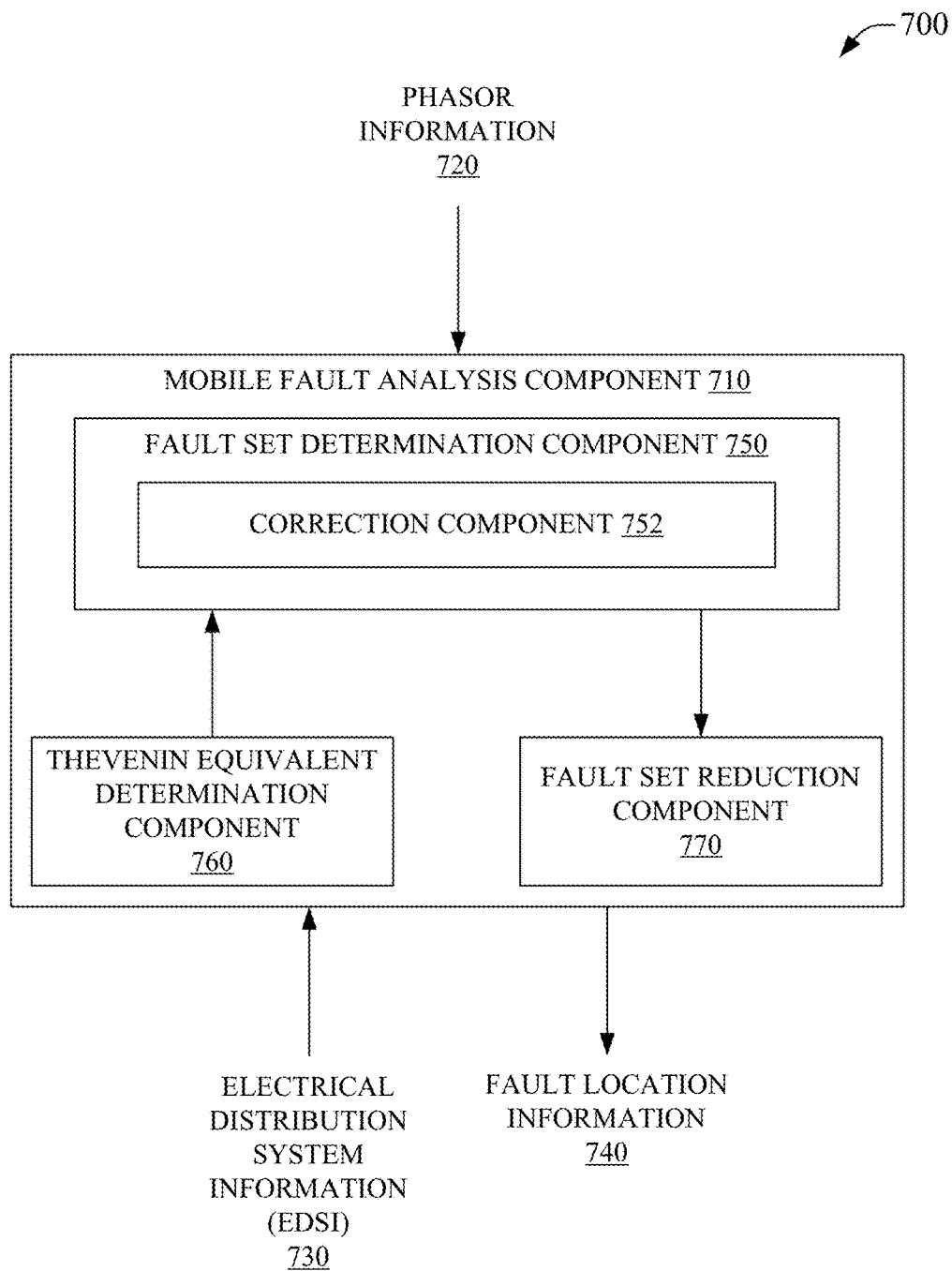
FIG. 7 illustrates a system that facilitates determining a fault set, comprising corrected fault location information, based on phasor information and Thevenin equivalent information in accordance with aspects of the subject disclosure.

FIG. 7 illustrates a system 700 that facilitates determining a fault set, comprising corrected fault location information, based on phasor information and Thevenin equivalent information in accordance with aspects of the subject disclosure. System 700 can comprise mobile fault analysis component 710 that can facilitate analysis of phasor information related to determining the location of a fault in an electrical energy distribution system. Mobile fault analysis component 710 can receive phasor information 720 over a wireless communications network, e.g., Wi-Fi, cellular, etc. Phasor information 720 can comprise phasor information related to one or more nodes of the electrical energy distribution system. In an aspect, phasor information 720 can comprise phasor measurement information from a phasor measurement unit (PMU). In an embodiment, phasor measurement information can be a synchrophasor measurement from a device that measures the electrical waves on an electricity grid using a common time source for synchronization.

Mobile fault analysis component 710 can further receive electrical distribution system information (EDSI) 730 from a wireless communications network. EDSI 730 can comprise a model of the electrical energy distribution system or parts of the electrical energy distribution system. EDSI 730 can further comprise measurement information from one or more nodes of the electrical energy distribution system, e.g., sensor information from various measurement points in the electrical energy distribution system.

Mobile fault analysis component 710 can facilitate access to fault location information 740. In an embodiment, access can be on a mobile device comprising system 700. In another embodiment, access can be on a device other than a mobile device comprising system 700. Fault location information 740 can comprise information related to a fault. Further, fault location information 740 can comprise a set of possible or candidate fault locations, a subset or reduced set of possible fault locations that excludes candidate faults not satisfying a determined criterion, etc.

Mobile fault analysis component 710 can determine a set of possible fault locations based on phasor information 720. Phasor information 720 can comprise voltage information for a first node, current information for current flowing between the first node and a second node. Further, EDSI received from EDSI data store 732 can comprise information for an impedance of the electrical energy distribution system line, hereinafter 'line', between the first node and the second node. This information can allow mobile fault analysis component 710 to determine a distance factor, d, that can be related to the conductor distance between the first node and the fault.

An electrical energy distribution system can be analyzed by mobile fault analysis component 710 in segments. A segment can be a portion of the electrical energy distribution system between a first node and a second node. In an aspect, the concatenation of the all segments of an electrical energy distribution system can describe the electrical energy distribution system. Segmental analysis of the electrical energy distribution system by mobile fault analysis component 710 can determine the presence of a possible fault a first segment of the electrical energy distribution system before proceeding with analysis on another segment of the electrical energy distribution system. Where a possible fault is determined for a segment, the set of fault location information can be updated to include information relating to the possible fault. As such, the set of fault location information can comprise a plurality of possible fault locations.

Segmental analysis of the electrical energy distribution system can employ equivalent circuits. Equivalent circuits can comprise simplified models representing portions of the electrical energy distribution system. In an embodiment, an equivalent circuit can be a Thevenin equivalent circuit that can represent the electrical energy distribution system or portions thereof, as resistor and source. Other equivalent circuits can similarly be employed, but for clarity and brevity are not further discussed herein. As such, mobile fault analysis component 710 can comprise Thevenin equivalent determination component 760. Thevenin equivalent determination component 760 can receive EDSI and can determine Thevenin equivalent circuits for portions of the electrical energy distribution system. This can facilitate segmental analysis by treating portions of an electrical grid beyond the segment under analysis as a Thevenin equivalent circuit. Thevenin equivalent circuits can be received by fault set determination component 750 and employed in determining potential fault location information.

Mobile fault analysis component 710 can comprise a fault set determination component 750. Fault set determination component 750 can determine a set of possible fault locations based on phasor information 720. Phasor information 720 can comprise voltage information for a first node, current information for current flowing between the first node and a second node. Further, EDSI can comprise information for an impedance of the electrical energy distribution system line, hereinafter 'line', between the first node and the second node. This information can allow fault set determination component 750 to determine a distance factor, d, that can be related to the conductor distance between the first node and the fault. In an embodiment, the distance factor can be described by Eq. 1, Eq. 2, etc., as disclosed herein in more detail with regard to FIG. 2, FIG. 3, etc. Fault set determination component 750 can determine a possible fault on a line segment. Further, analysis of the line segment can employ equivalent circuits for portions of the electrical energy distribution system model outside the segment under analysis, e.g., as made available by Thevenin equivalent determination component 760. In an embodiment, fault set determination component 750 can comprise correction component 752 that can update fault information comprising the set of fault location information to compensate for errors that can be introduced by the inherent electrical characteristics of a corresponding fault.

Mobile fault analysis component 710 can further determine a subset of possible fault locations from the set of fault locations based on phasor information 720. Whereas phasor information 720 can include phasor information from a second PMU, this information can be used to validate fault locations in the set of possible fault locations. This can serve to remove possible fault information in the subset for possible faults that do not meet a threshold criterion. As an example, where the a possible fault location determined from phasor information from a first PMU is within a determined distance of a possible fault location determined from phasor information from a second PMU, the possible fault location can be regarded as validated and can be included in the subset of possible fault locations. The use of a threshold criterion in validating possible fault locations can compensate for errors in EDSI 730, errors in phasor information 720, etc.

Figure 8:
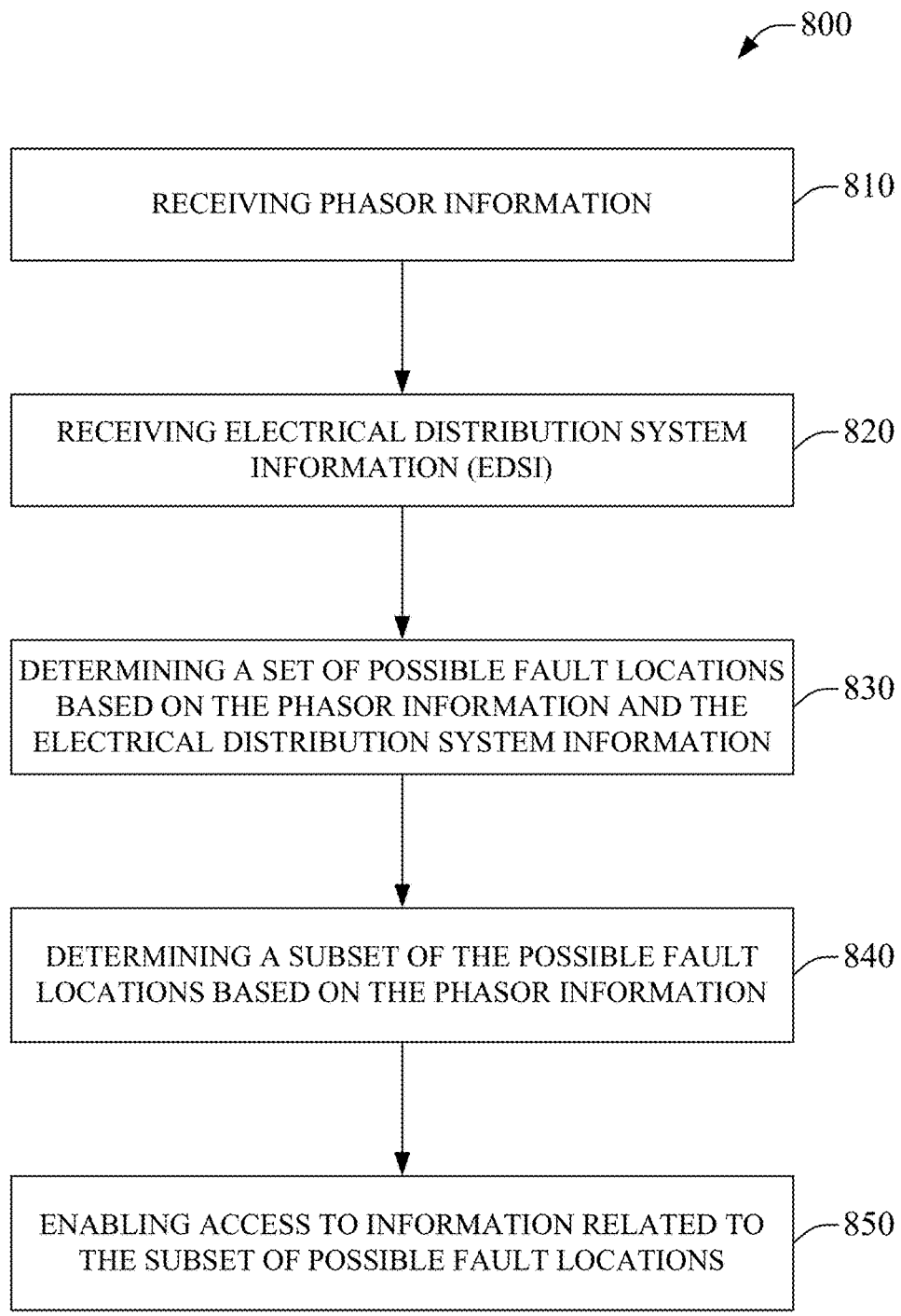
FIG. 8 illustrates a method facilitating determining fault location information based on phasor information in accordance with aspects of the subject disclosure.
Figure 9:
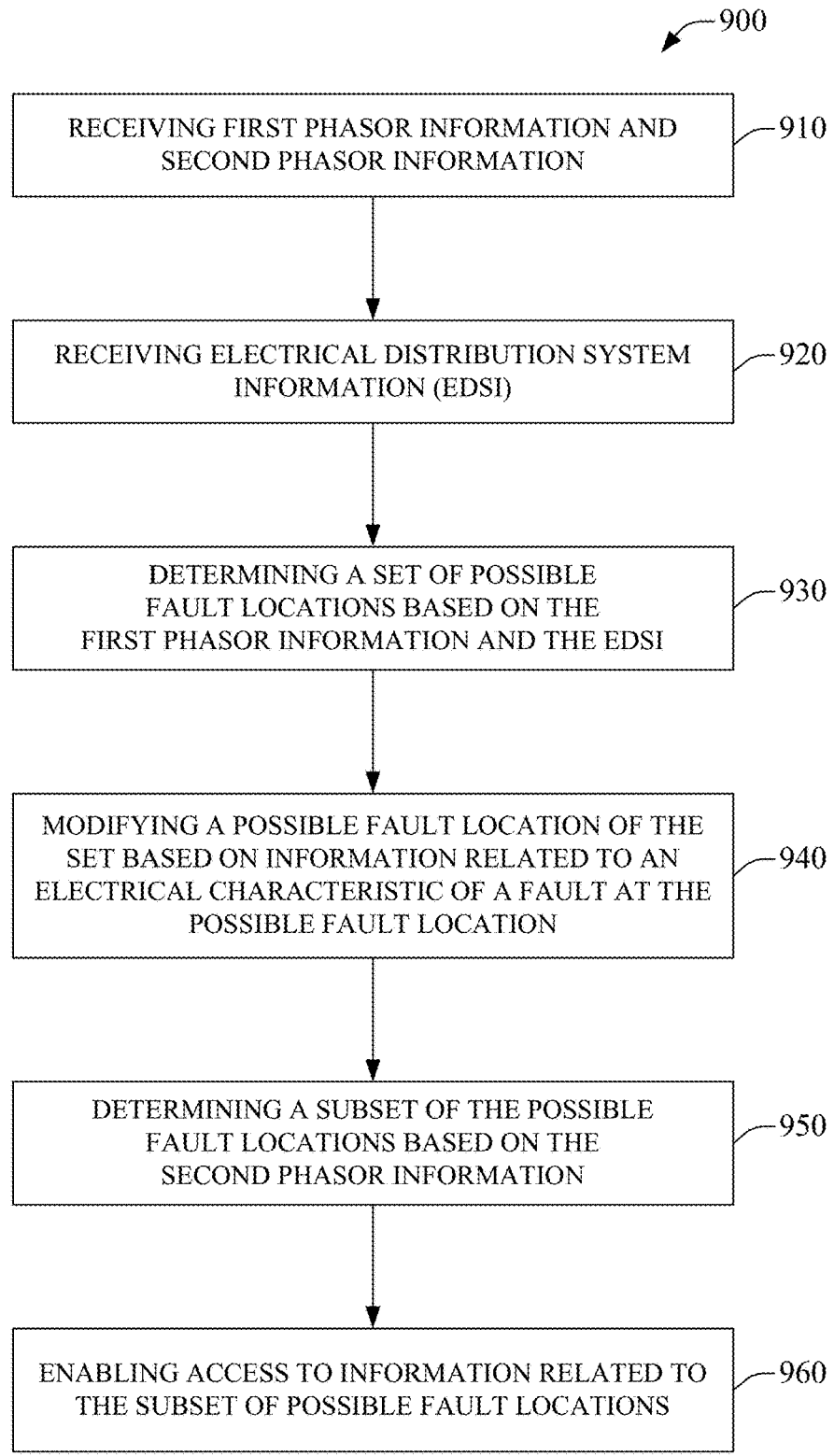
FIG. 9 depicts a method facilitating determining fault location information, modified in response to electrical characteristics of a fault at the fault location, based on phasor information in accordance with aspects of the subject disclosure.

In view of the example system(s) described above, example method(s) that can be implemented in accordance with the disclosed subject matter can be better appreciated with reference to flowcharts in FIG. 8-FIG. 9. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 8 illustrates aspects of method 800 facilitating determining fault location information based on phasor information in accordance with aspects of the subject disclosure. At 810, method 800 can include receiving phasor information. Phasor information can comprise phasor information related to one or more nodes of an electrical energy distribution system. In an aspect, phasor information can comprise phasor measurement information from a phasor measurement unit (PMU). Phasor measurement information can comprise information related to voltage, current, resistance, impedance, admittance, phase, measurement timestamp, etc. In an embodiment, phasor measurement information can be a synchrophasor measurement from a device that measures the electrical waves on an electricity grid using a common time source for synchronization. Time synchronized measurements can facilitate real-time measurements of multiple remote measurement points on the grid in a synchronized manner. This can, in some embodiments, allow for a snapshot of electrical characteristic values for the electrical energy distribution system at multiple nodes simultaneously, which can aid analysis of electrical energy distribution system events, such as fault analysis.

At 820, method 800 can include receiving electrical distribution system information (EDSI). EDSI can comprise a model of the electrical energy distribution system or parts of the electrical energy distribution system. EDSI can further comprise measurement information from one or more nodes of the electrical energy distribution system, e.g., sensor information from various measurement points in the electrical energy distribution system. As an example, EDSI can comprise information related to a distributed generation (DG) source connected to the electrical energy distribution system, e.g., voltage, current, admittance, reactance, etc., information for a DG source placing energy into the electrical energy distribution system, etc.

At 830, method 800 can comprise determining a set of possible fault locations. This determination can be based on the phasor information and the EDSI. Whereas phasor information can comprise voltage information for a first node, current information for current flowing between the first node and a second node, and EDSI can comprise information for an impedance of the electrical energy distribution system line, hereinafter 'line', between the first node and the second node, this information can allow determining a distance factor, d. Distance factor, d, can be related to the conductor distance between the first node and the fault. The distance factor, d, can further be related to the ratio of the voltage and current measured at the first node, when a fault is present, to the expected voltage and current at the first node based on a model of the electrical energy distribution system between the first node and the second node in the absence of a fault. In an embodiment, the distance factor can be described by Eq. 1, Eq. 2, etc., as disclosed hereinabove in more detail with regard to FIG. 2, FIG. 3, etc.

An electrical energy distribution system can be analyzed in segments. A segment can be a portion of the electrical energy distribution system between a first node and a second node. In an aspect, the concatenation of the all segments of an electrical energy distribution system can describe the electrical energy distribution system. Segmental analysis of the electrical energy distribution system can determine the presence of a possible fault at a first segment of the electrical energy distribution system before proceeding with analysis on another segment of the electrical energy distribution system. Where a possible fault is determined for a segment, the set of fault location information can be updated to include information relating to the possible fault. As such, the set of fault location information can comprise a plurality of possible fault locations.

At 840, method 800 can comprise determining a subset of possible fault locations from the set of fault locations based on the phasor information. Whereas phasor information can include phasor information from a second PMU, this information can be used to validate fault locations in the set of possible fault locations determined at 830. This can serve to remove possible fault information in the subset for candidate faults that do not meet a threshold criterion. As an example, where the a possible fault location determined from phasor information from a first PMU is within a determined distance of a possible fault location determined from phasor information from a second PMU, the possible fault location can be regarded as valid and can be included in the subset of possible fault locations. The use of a threshold criterion in validating possible fault locations can compensate for errors in EDSI, errors in phasor information, etc.

At 850, method 800 can comprise enabling access to information related to the subset of possible fault locations. At this point, method 800 can end. The information related to the subset of possible fault locations can comprise information related to a fault, including conductor distance to a fault, geographic distance to a fault, a location of a fault, electrical characteristics of a fault, etc. Further, the information related to the subset of possible fault locations can comprise a set of possible or candidate fault locations, a subset or reduced set of possible fault locations that excludes candidate faults not satisfying a determined criterion, no possible faults, some possible faults, all possible faults, faults resident in designated portions of the electrical energy distribution system, faults satisfying a determined priority criterion, etc.

FIG. 9 illustrates a method 900 that facilitates determining fault location information, modified in response to electrical characteristics of a fault at the fault location, based on phasor information in accordance with aspects of the subject disclosure. At 910, method 900 can include receiving first phasor information and second phasor information. Phasor information can comprise phasor information related to one or more nodes of an electrical energy distribution system. In an aspect, phasor information can comprise phasor measurement information from a phasor measurement unit (PMU). Phasor measurement information can comprise information related to voltage, current, resistance, impedance, admittance, phase, measurement timestamp, etc. In an embodiment, phasor measurement information can be a synchrophasor measurement from a device that measures the electrical waves on an electricity grid using a common time source for synchronization. In an aspect, first phasor information can be related to measurements from a first PMU, e.g., at a first node of the electrical energy distribution system. Second phasor information can be related to measurements from a second PMU, e.g., at a second node of the electrical energy distribution system.

At 920, method 900 can include receiving electrical distribution system information (EDSI). EDSI can comprise a model of the electrical energy distribution system or parts of the electrical energy distribution system. EDSI can further comprise measurement information from one or more nodes of the electrical energy distribution system, e.g., sensor information from various measurement points in the electrical energy distribution system.

At 930, method 900 can comprise determining a set of possible fault locations. This determination can be based on the first phasor information and the EDSI. Whereas first phasor information can comprise first voltage information for a first node, first current information for current flowing between the first node and a second node, and EDSI can comprise information for a first impedance of the electrical energy distribution line between the first node and the second node, this information can allow determining a distance factor, d. Distance factor, d, can be related to the conductor distance between the first node and the fault. The distance factor, d, can further be related to the ratio of the voltage and current measured at the first node, when a fault is present, to the expected voltage and current at the first node based on a model of the electrical energy distribution system between the first node and the second node in the absence of a fault An electrical energy distribution system can be analyzed in segments. A segment can be a portion of the electrical energy distribution system between a first node and a second node. Segmental analysis of the electrical energy distribution system can determine the presence of a possible fault at a first segment of the electrical energy distribution system before proceeding with analysis on another segment of the electrical energy distribution system. Where a possible fault is determined for a segment, the set of fault location information can be updated to include information relating to the possible fault. As such, the set of fault location information can comprise a plurality of possible fault locations.

At 940, method 900 can comprise modifying a possible fault location of the set of possible fault locations. This can be based on information related to the electrical characteristics of a fault at the possible fault location. Modifying a possible fault location, e.g., modifying fault location information, can comprise compensating for errors that can be introduced by the inherent electrical characteristics of the corresponding fault. As an example, a first fault, F, at a first location can have a different resistance than a second fault, F', at the first location. The difference in the resistance of F and F' can result in different determined values of the distance factor, d, despite both faults being located at the first location. Compensating for the different resistances can therefore result in an updated d value for both F and F' that can allow for more accurate determination of their being at the first location.

At 950, method 900 can comprise determining a subset of possible fault locations from the set of fault locations based on the second phasor information. Whereas phasor information can include second phasor information from a second PMU, this information can be used to validate fault locations in the set of possible fault locations determined at 930 by employing the first phasor information. This can serve to remove possible fault information in the subset for candidate faults that do not meet a threshold criterion. The use of a threshold criterion in validating possible fault locations can compensate for errors in EDSI, errors in first or second phasor information, etc.

At 960, method 900 can comprise enabling access to information related to the subset of possible fault locations. At this point, method 900 can end. The information related to the subset of possible fault locations can comprise information related to a fault, including conductor distance to a fault, geographic distance to a fault, a location of a fault, electrical characteristics of a fault, etc. Further, the information related to the subset of possible fault locations can comprise a set of possible or candidate fault locations, a subset or reduced set of possible fault locations that excludes candidate faults not satisfying a determined criterion, no possible faults, some possible faults, all possible faults, faults resident in designated portions of the electrical energy distribution system, faults satisfying a determined priority criterion, etc.

Figure 10:
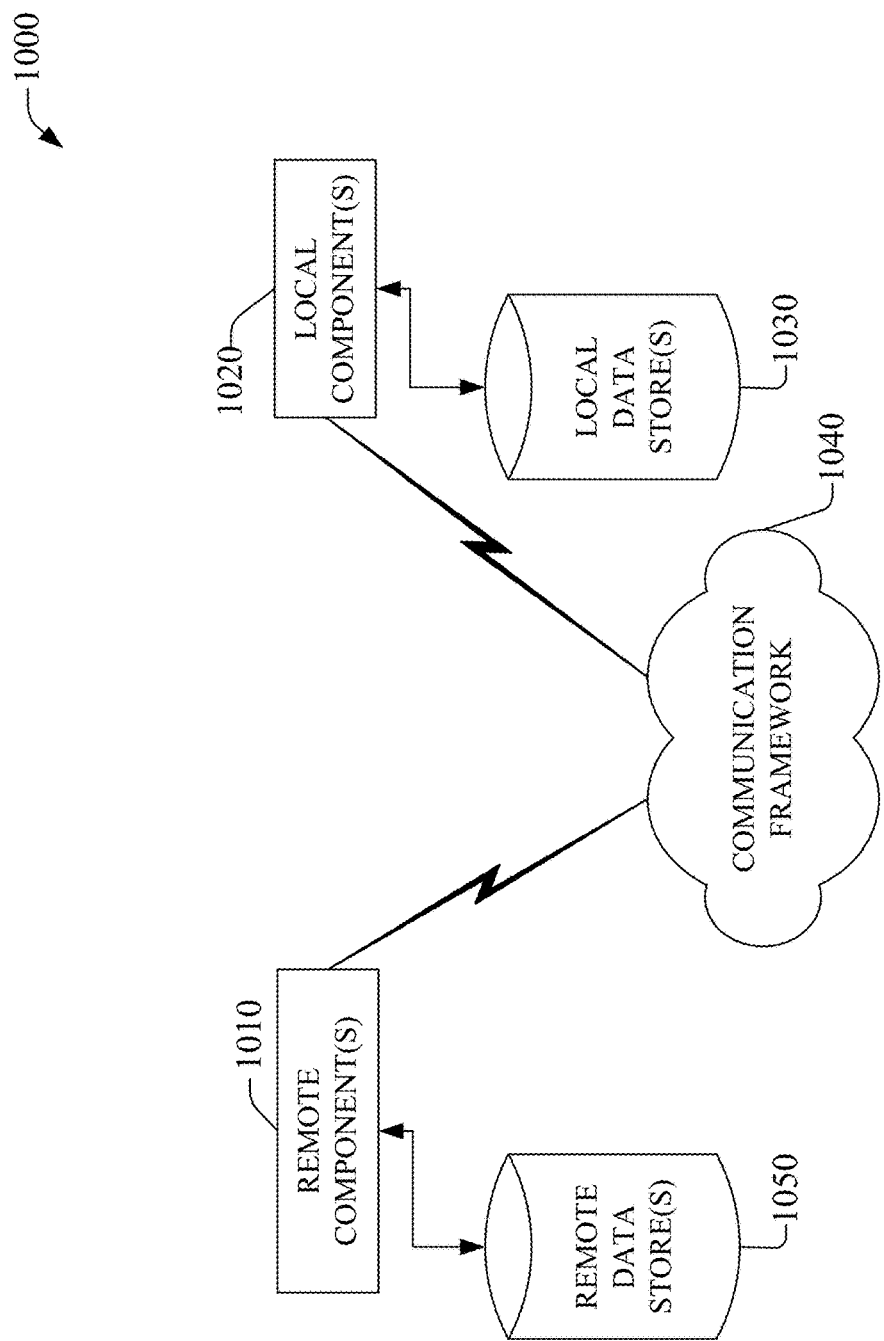
FIG. 10 depicts a schematic block diagram of a computing environment with which the disclosed subject matter can interact.

FIG. 10 is a schematic block diagram of a computing environment 1000 with which the disclosed subject matter can interact. The system 1000 includes one or more remote component(s) 1010. The remote component(s) 1010 can be hardware and/or software (e.g., threads, processes, computing devices). In some embodiments, remote component(s) 1010 can include servers, personal servers, wireless telecommunication network devices, etc. As an example, remote component(s) 1010 can be a device of a wireless carrier network, e.g., a RAN. As another example, remote component(s) 1010 can be a server associated with a cloud computing provider device.

The system 1000 also includes one or more local component(s) 1020. The local component(s) 1020 can be hardware and/or software (e.g., threads, processes, computing devices). In some embodiments, local component(s) 1020 can include mobile fault analysis component 710, e.g., embodied in a mobile device. As an example, local component(s) 1020 can be a mobile fault analysis component 710 embodied in a smartphone configured to receive phasor information, e.g., 120, 520, 620, 720, etc.

One possible communication between a remote component(s) 1010 and a local component(s) 1020 can be in the form of a data packet adapted to be transmitted between two or more computer processes. Another possible communication between a remote component(s) 1010 and a local component(s) 1020 can be in the form of circuit-switched data adapted to be transmitted between two or more computer processes in radio time slots. As an example, phasor information, EDSI, Thevenin equivalent circuit information, etc., can be communicated over a packet-switched or circuit-switched channels between remote component 1010, and a mobile device, e.g., a local component 1020, via an air interface, such as on a packet-switched or circuit-switched downlink channel. The system 1000 includes a communication framework 1040 that can be employed to facilitate communications between the remote component(s) 1010 and the local component(s) 1020, and can include an air interface, e.g., Uu interface of a UMTS network. Remote component(s) 1010 can be operably connected to one or more remote data store(s) 1050, such as a EDSI data store 632, etc., that can be employed to store information, such as phasor information, EDSI, equivalent circuit information, etc., on the remote component(s) 1010 side of communication framework 1040. Similarly, local component(s) 1020 can be operably connected to one or more local data store(s) 1030, that can be employed to store information, such as received phasor information, EDSI, equivalent circuit information, etc., on the to the local component(s) 1020 side of communication framework 1040.

Figure 11:
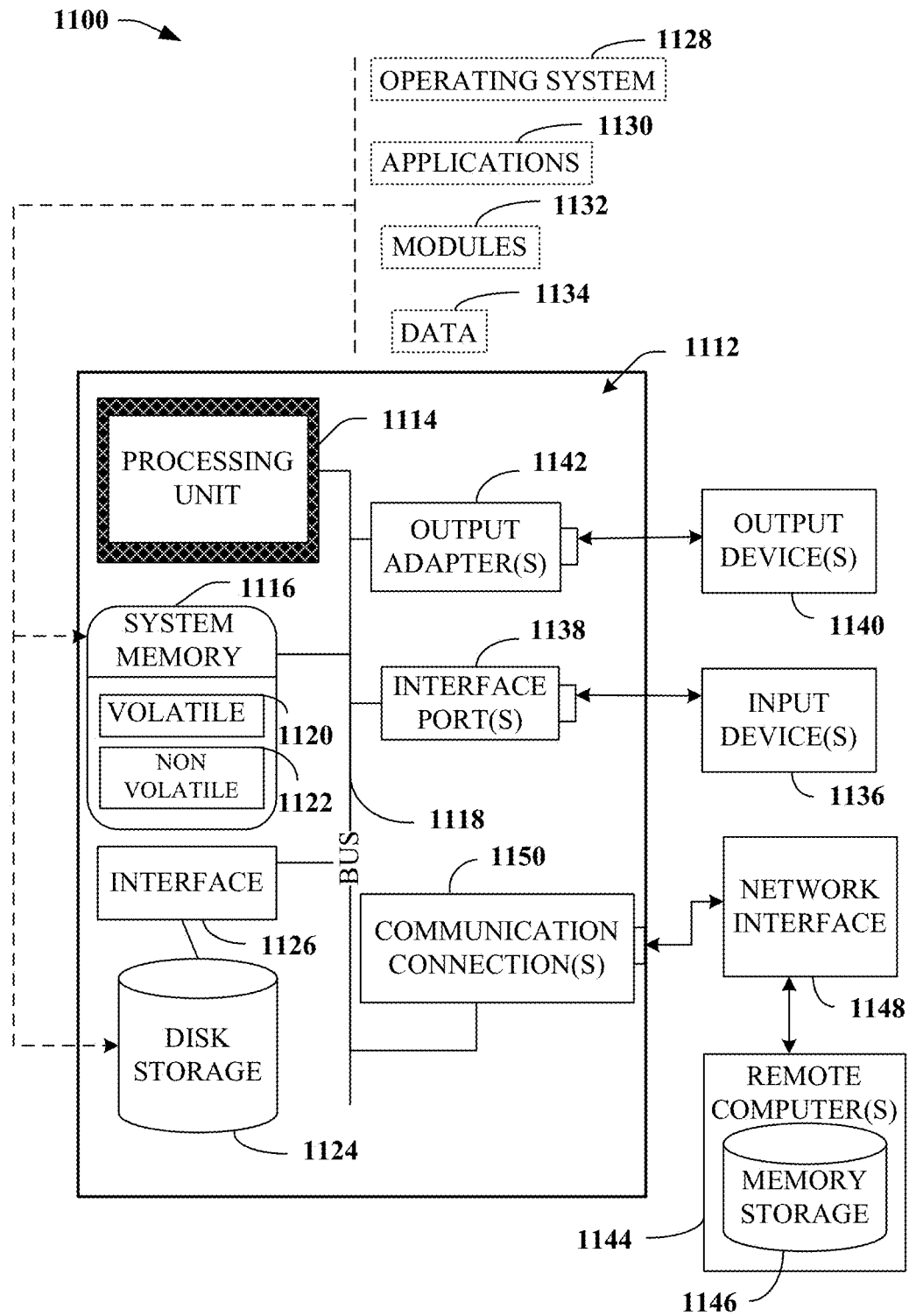
FIG. 11 illustrates a block diagram of a computing system operable to execute the disclosed systems and methods in accordance with an embodiment.

In order to provide a context for the various aspects of the disclosed subject matter, FIG. 11, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules include routines, programs, components, data structures, etc. that performs particular tasks and/or implement particular abstract data types.

In the subject specification, terms such as "store," "storage," "data store," "data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can include both volatile and nonvolatile memory, by way of illustration, and not limitation, volatile memory 1120 (see below), non-volatile memory 1122 (see below), disk storage 1124 (see below), and memory storage 1146 (see below). Further, nonvolatile memory can be included in read only memory, programmable read only memory, electrically programmable read only memory, electrically erasable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, including single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 11 illustrates a block diagram of a computing system 1100 operable to execute the disclosed systems and methods in accordance with an embodiment. Computer 1112, which can be, for example, part of a mobile device embodying mobile fault analysis component 710, etc., fault analysis component 110, 510, 610, etc., or employing method 800, 900, etc., includes a processing unit 1114, a system memory 1116, and a system bus 1118. System bus 1118 couples system components including, but not limited to, system memory 1116 to processing unit 1114. Processing unit 1114 can be any of various available processors. Dual microprocessors and other multiprocessor architectures also can be employed as processing unit 1114.

System bus 1118 can be any of several types of bus structure(s) including a memory bus or a memory controller, a peripheral bus or an external bus, and/or a local bus using any variety of available bus architectures including, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1116 can include volatile memory 1120 and nonvolatile memory 1122. A basic input/output system, containing routines to transfer information between elements within computer 1112, such as during start-up, can be stored in nonvolatile memory 1122. By way of illustration, and not limitation, nonvolatile memory 1122 can include read only memory, programmable read only memory, electrically programmable read only memory, electrically erasable read only memory, or flash memory. Volatile memory 1120 includes read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synchlink dynamic read only memory, Rambus direct read only memory, direct Rambus dynamic read only memory, and Rambus dynamic read only memory.

Computer 1112 can also include removable/non-removable, volatile/non-volatile computer storage media. FIG. 11 illustrates, for example, disk storage 1124. Disk storage 1124 includes, but is not limited to, devices like a magnetic disk drive, floppy disk drive, tape drive, flash memory card, or memory stick. In addition, disk storage 1124 can include storage media separately or in combination with other storage media including, but not limited to, an optical disk drive such as a compact disk read only memory device, compact disk recordable drive, compact disk rewritable drive or a digital versatile disk read only memory. To facilitate connection of the disk storage devices 1124 to system bus 1118, a removable or non-removable interface is typically used, such as interface 1126.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can include non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

It can be noted that FIG. 11 describes software that acts as an intermediary between users and computer resources described in suitable operating environment 1100. Such software includes an operating system 1128. Operating system 1128, which can be stored on disk storage 1124, acts to control and allocate resources of computer system 1112. System applications 1130 take advantage of the management of resources by operating system 1128 through program modules 1132 and program data 1134 stored either in system memory 1116 or on disk storage 1124. It is to be noted that the disclosed subject matter can be implemented with various operating systems or combinations of operating systems.

A user can enter commands or information into computer 1112 through input device(s) 1136. As an example, a user interface can be embodied in a touch sensitive display panel allowing a user to interact with computer 1112. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1114 through system bus 1118 by way of interface port(s) 1138. Interface port(s) 1138 include, for example, a serial port, a parallel port, a game port, a universal serial bus, an infrared port, a Bluetooth port, an IP port, or a logical port associated with a wireless service, etc. Output device(s) 1140 use some of the same type of ports as input device(s) 1136.

Thus, for example, a universal serial busport can be used to provide input to computer 1112 and to output information from computer 1112 to an output device 1140. Output adapter 1142 is provided to illustrate that there are some output devices 1140 like monitors, speakers, and printers, among other output devices 1140, which use special adapters. Output adapters 1142 include, by way of illustration and not limitation, video and sound cards that provide means of connection between output device 1140 and system bus 1118. It should be noted that other devices and/or systems of devices provide both input and output capabilities such as remote computer(s) 1144. As an example, vehicle subsystems, such as headlights, brake lights, stereos, vehicle information sharing device, etc., can include an output adapter 1142 to enable use in accordance with the presently disclosed subject matter.

Computer 1112 can operate in a networked environment using logical connections to one or more remote computers, such as remote computer(s) 1144. Remote computer(s) 1144 can be a personal computer, a server, a router, a network PC, cloud storage, cloud service, a workstation, a microprocessor based appliance, a peer device, or other common network node and the like, and typically includes many or all of the elements described relative to computer 1112.

For purposes of brevity, only a memory storage device 1146 is illustrated with remote computer(s) 1144. Remote computer(s) 1144 is logically connected to computer 1112 through a network interface 1148 and then physically connected by way of communication connection 1150. Network interface 1148 encompasses wire and/or wireless communication networks such as local area networks and wide area networks. Local area network technologies include fiber distributed data interface, copper distributed data interface, Ethernet, Token Ring and the like. Wide area network technologies include, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1150 refer(s) to hardware/software employed to connect network interface 1148 to bus 1118. While communication connection 1150 is shown for illustrative clarity inside computer 1112, it can also be external to computer 1112. The hardware/software for connection to network interface 1148 can include, for example, internal and external technologies such as modems, including regular telephone grade modems, cable modems and digital subscriber line modems, integrated services digital network adapters, and Ethernet cards.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Moreover, terms like "user equipment (UE)," "mobile station," "mobile," subscriber station," "subscriber equipment," "access terminal," "terminal," "handset," and similar terminology, refer to a wireless device utilized by a subscriber or user of a wireless communication service to receive or convey data, control, voice, video, sound, gaming, or substantially any data-stream or signaling-stream. The foregoing terms are utilized interchangeably in the subject specification and related drawings. Likewise, the terms "access point," "base station," "Node B," "evolved Node B," "home Node B," "home access point," and the like, are utilized interchangeably in the subject application, and refer to a wireless network component or appliance that serves and receives data, control, voice, video, sound, gaming, or substantially any data-stream or signaling-stream to and from a set of subscriber stations or provider enabled devices. Data and signaling streams can include packetized or frame-based flows.

Additionally, the terms "core-network", "core", "core carrier network", "carrier-side", or similar terms can refer to components of a telecommunications network that typically provides some or all of aggregation, authentication, call control and switching, charging, service invocation, or gateways. Aggregation can refer to the highest level of aggregation in a service provider network wherein the next level in the hierarchy under the core nodes is the distribution networks and then the edge networks. UEs do not normally connect directly to the core networks of a large service provider but can be routed to the core by way of a switch or radio access network. Authentication can refer to determinations regarding whether the user requesting a service from the telecom network is authorized to do so within this network or not. Call control and switching can refer determinations related to the future course of a call stream across carrier equipment based on the call signal processing. Charging can be related to the collation and processing of charging data generated by various network nodes. Two common types of charging mechanisms found in present day networks can be prepaid charging and postpaid charging. Service invocation can occur based on some explicit action (e.g. call transfer) or implicitly (e.g., call waiting). It is to be noted that service "execution" may or may not be a core network functionality as third party network/nodes may take part in actual service execution. A gateway can be present in the core network to access other networks. Gateway functionality can be dependent on the type of the interface with another network.

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks include broadcast technologies (e.g., sub-Hertz, extremely low frequency, very low frequency, low frequency, medium frequency, high frequency, very high frequency, ultra-high frequency, super-high frequency, terahertz broadcasts, etc.); Ethernet; X.25; powerline-type networking, e.g., Powerline audio video Ethernet, etc; femto-cell technology; Wi-Fi; worldwide interoperability for microwave access; enhanced general packet radio service; third generation partnership project, long term evolution; third generation partnership project universal mobile telecommunications system; third generation partnership project 2, ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
a memory to store executable instructions; and
a processor coupled to the memory, that executes or facilitates execution of the executable instructions to perform operations, comprising:
receiving phasor information related to determining a location of a fault in an electrical energy distribution system comprising multiple energy distribution branches, wherein the phasor information comprises a time synchronized measurement of an electrical characteristic of the electrical energy distribution system at a time by a single first phasor measurement unit device, and wherein the fault comprises a phase-to-ground fault;
receiving electrical distribution system information related to the electrical energy distribution system, wherein the electrical distribution system information comprises a model of at least a portion of the electrical energy distribution system at the time;

determining fault location information based on the phasor information and the electrical distribution system information, wherein the fault location information comprises one or more potential fault locations on one or more branches of the multiple energy distribution branches;

selecting at least one likely fault location from the one or more potential fault locations of the fault location information based on subsequent phasor information received after the receiving of the phasor information and received from a single second phasor measurement unit device, wherein the likely fault location is more likely to correspond to the fault than another fault location of the one or more potential fault locations; and initiating dispatch of a repair resource in response to the fault in the electrical energy distribution system based on the at least one likely fault location, wherein the dispatch of the repair resource results in a repair of the fault in the electrical energy distribution system.

2. The system of claim 1, wherein the determining the at least one likely fault location is performed at an energy management system device related to management or control of the electrical energy distribution system.

3. The system of claim 1, wherein the determining the at least one likely fault location is performed at a mobile device.

4. The system of claim 3, wherein the receiving the phasor information is via an interface of the mobile device in communication with an energy management system.

5. The system of claim 3, wherein the receiving the phasor information is via an interface of the mobile device in communication with the single first phasor measurement unit device of the electrical energy distribution system.

6. The system of claim 3, wherein the subsequent phasor information is received from the single second phasor measurement unit device via the interface of the mobile device.

7. The system of claim 1, wherein the operations further comprise determining a distance factor related to a distance of the at least one likely fault location from a node device of the electrical energy distribution system.

8. The system of claim 7, wherein the operations further comprise determining a candidate fault set based on the distance factor, wherein the candidate fault set comprises the at least one likely fault location.

9. The system of claim 8, wherein the operations further comprise determining a subset of the candidate fault set based on the at least one likely fault location satisfying a condition related to the fault.

10. The system of claim 1, wherein the operations further comprise modifying the fault location information based on an electrical characteristic of the fault.

11. The system of claim 10, wherein the modifying the fault location information is performed iteratively and comprises satisfying a condition related to a determined threshold value.

12. The system of claim 10, wherein the modifying the fault location information comprises modifying the fault location information using a non-linear equation.

13. A method, comprising:

receiving, by a device comprising a processor, first phasor information from a single first phasor measurement unit device in response to detecting a fault event for an electrical energy distribution system, wherein the fault event comprises a fault that is a phase-to-ground fault;

receiving, by the device, electrical distribution system information comprising parameters related to the electrical energy distribution system comprising at least two different energy distribution pathways;

determining, by the device, fault location information comprising at least one possible fault location on at least one of the at least two different energy distribution pathways based on the phasor information and the electrical distribution system information;

determining a probable fault location from the at least one possible fault location of the fault location information based on second phasor information from a single second phasor measurement unit device, wherein the probable fault location is more likely to be a true fault location than another possible fault location of the at least one probable fault location; and initiating deployment of repair resources that cause a repair to the fault in response to the fault event of the electrical energy distribution system based on the probable fault location comprised in the fault location information.

14. The method of claim 13, wherein the receiving the first phasor information comprises receiving time synchronized polyphasic voltage information.

15. The method of claim 13, wherein the receiving the electrical distribution system information comprises receiving a model of the electrical characteristics of the electrical energy distribution system.

16. The method of claim 15, wherein the model comprises a circuit model representing a portion of the electrical energy distribution system.

17. The method of claim 16, wherein the circuit model is a Thevenin equivalent circuit model of the portion of the electrical energy distribution system.

18. The method of claim 13, wherein the device is a mobile device.

19. The method of claim 13, wherein an energy management system, related to management or control of the electrical energy distribution system, comprises the device.

20. A computer readable storage device comprising executable instructions that, in response to execution, cause a device comprising a processor to perform operations, comprising:

receiving first phasor information related to determining a first candidate location of a fault on a first energy distribution path in an electrical energy distribution system comprising at least a second energy distribution path that is a different path than the first energy distribution path, wherein the first phasor information is for a determined time from a first phasor measurement unit device, wherein the fault comprises an unintended phase-to-ground electrical pathway;

receiving second phasor information related to determining a second candidate location of the fault in the electrical energy distribution system, wherein the second phasor information is for the determined time from a second phasor measurement unit device;

receiving electrical distribution system information related the electrical energy distribution system, wherein the electrical distribution system information comprises a model of at least a portion of the electrical energy distribution system for the determined time;

determining a fault location information set comprising fault information related to the fault based on the first phasor information and the electrical distribution system information;

determining a subset of the fault location information set based on validating the fault by employing the second phasor information and the electrical distribution system information, wherein the validating removes an invalid fault location of the fault location information set;

causing a repair of the fault to be performed via dispatch of a repair resource in response to the fault in the electrical energy distribution system based on the subset of the fault location information set; and facilitating access to the fault information of the subset.

21. The computer readable storage device of claim 20, wherein the operations further comprise correcting the fault information based on an electrical impedance of the fault.

22. The computer readable storage device of claim 20, wherein the facilitating access to the fault information facilitates enabling a mobile device to access the fault information of the subset.

23. The computer readable storage device of claim 20, wherein the model is an equivalent circuit model, related to management or control of the electrical energy distribution system, representing a portion of the electrical energy distribution system.

24. The computer readable storage device of claim 23, wherein the equivalent circuit model is a Thevenin equivalent circuit model representing the portion of the electrical energy distribution system.

25. The computer readable storage device of claim 23, wherein the equivalent circuit model representing the portion of the electrical energy distribution system is received from a data storage device located separately from the device.

* * * * *

UNITED STATES PATENT AND TRADEMARK OFFICE
CERTIFICATE OF CORRECTION

| | | |
|---|---|---|
| PATENT NO. | : 10,401,417 B2 | Page 1 of 1 |
| APPLICATION NO. | : 14/158108 | |
| DATED | : September 3, 2019 | |
| INVENTOR(S) | : Jinfeng Ren et al. | |

It is certified that error appears in the above-identified patent and that said Letters Patent is hereby corrected as shown below:

In the Specification

Column 1, Line 12 Add Paragraph:
GOVERNMENT CONTRACT
This invention was made with government support under DE-OE0000551 awarded by US Department of Energy. The government has certain rights in the invention.

Signed and Sealed this
Twenty-eighth Day of October, 2025

John A. Squires
*Director of the United States Patent and Trademark Office*